(12) United States Patent
Wegener

(10) Patent No.: US 9,274,802 B2
(45) Date of Patent: Mar. 1, 2016

(54) DATA COMPRESSION AND DECOMPRESSION USING SIMD INSTRUCTIONS

(71) Applicant: Altera Corporation, San Jose, CA (US)

(72) Inventor: Albert W. Wegener, Aptos Hills, CA (US)

(73) Assignee: Altera Corporation, San Jose, CA (US)

( * ) Notice: Subject to any disclaimer, the term of this patent is extended or adjusted under 35 U.S.C. 154(b) by 589 days.

(21) Appl. No.: 13/747,342

(22) Filed: Jan. 22, 2013

(65) Prior Publication Data
US 2014/0208068 A1   Jul. 24, 2014

(51) Int. Cl.
| | |
|---|---|
| G06F 9/38 | (2006.01) |
| G06F 7/38 | (2006.01) |
| H03M 7/30 | (2006.01) |
| H03M 7/24 | (2006.01) |
| G06F 9/00 | (2006.01) |
| H03M 13/27 | (2006.01) |

(52) U.S. Cl.
CPC ............ *G06F 9/3887* (2013.01); *G06F 7/38* (2013.01); *H03M 7/24* (2013.01); *H03M 7/3059* (2013.01); *H03M 7/6005* (2013.01); *H03M 13/27* (2013.01)

(58) Field of Classification Search
None
See application file for complete search history.

(56) References Cited

U.S. PATENT DOCUMENTS

| | | | |
|---|---|---|---|
| 5,839,100 A | 11/1998 | Wegener | |
| 7,009,533 B1 | 3/2006 | Wegener | |
| 8,301,803 B2 | 10/2012 | Wegener | |
| 2008/0183791 A1 | 7/2008 | Ho et al. | |
| 2010/0002793 A1 | 1/2010 | Dent et al. | |
| 2010/0191525 A1* | 7/2010 | Rabenko | H04B 3/23 704/211 |
| 2010/0251076 A1 | 9/2010 | Wu et al. | |
| 2011/0078222 A1 | 3/2011 | Wegener | |
| 2011/0219208 A1 | 9/2011 | Asaad et al. | |
| 2012/0166510 A1 | 6/2012 | Chen et al. | |
| 2013/0007076 A1 | 1/2013 | Wegener | |

OTHER PUBLICATIONS

PCT International Search Report and Written Opinion of the International Searching Authority for Application No. PCT/US2014/012565, Apr. 24, 2014, 9 sheets.
Wegener, Albert W., U.S. Appl. No. 13/616,898 entitled "Processing System and Method Including Data Compression API," filed Sep. 14, 2012, 83 pages.

(Continued)

*Primary Examiner* — Scott Sun
(74) *Attorney, Agent, or Firm* — Okamoto & Benedicto LLP

(57) ABSTRACT

Compression and decompression of numerical data utilizing single instruction, multiple data (SIMD) instructions is described. The numerical data includes integer and floating-point samples. Compression supports three encoding modes: lossless, fixed-rate, and fixed-quality. SIMD instructions for compression operations may include attenuation, derivative calculations, bit packing to form compressed packets, header generation for the packets, and packed array output operations. SIMD instructions for decompression may include packed array input operations, header recovery, decoder control, bit unpacking, integration, and amplification. Compression and decompression may be implemented in a microprocessor, digital signal processor, field-programmable gate array, application-specific integrated circuit, system-on-chip, or graphics processor, using SIMD instructions. Compression and decompression of numerical data can reduce memory, networking, and storage bottlenecks. This abstract does not limit the scope of the invention as described in the claims.

43 Claims, 36 Drawing Sheets

(56) References Cited

OTHER PUBLICATIONS

Wegener, Albert W., U.S. Appl. No. 13/617,061 entitled "Conversion and Compression of Floating-Point and Integer Data," filed Sep. 14, 2012, 78 pages.

Wegener, Albert W., U.S. Appl. No. 13/617,205 entitled "Data Compression for Direct Memory Access Transfers," filed Sep. 14, 2012, 70 pages.

Wegener, Albert W., U.S. Appl. No. 13/747,352 entitled "SIMD Instructions for Data Compression and Decompression," filed Jan. 22, 2013, 94 pages.

Lomont, Chris, "Introduction to Intel Advanced Vector Extensions," http://software.intel.com/en-us/articles/introduction-to-intel-advanced-vector-extensions, May 23, 2011, 21 pages.

Raman, S. K. et al., "Implementing Streaming SIMD Extensions on the Pentium III Processor," IEEE Micro, Jul./Aug. 2000 (vol. 20, Issue 4), pp. 47-57.

"Intel Advanced Vector Extensions Programming Reference," Jun. 2011, software.intel.com/sites/default/files/m/f/7/c/36945; also http://software.intel.com/sites/default/files/319433-014.pdf, 595 pages.

Hillar, Gaston, "Intel AVX2 Will Bring Integer Instructions with 256-bit SIMD Numeric Processing Capabilities," Dr Dobb's Bloggers, Jun. 24, 2011, http://www.drdobbs.com/tools/intel-avx2-will-bring-integer-instructio/231000372, 5 pages.

Mula, Wojciech, "SSSSE3: fast popcount," http://wm.ite.pl/articles/sse-popcount.html, May 24, 2008 (updated Jun. 28, 2010), 5 pages.

Hamburg, Mike, "Accelerating AES with Vector Permute Instructions," Cryptographic Hardware and Embedded Systems—CHES 2009, Lecture Notes in Computer Science vol. 5747, 2009, pp. 18-32.

* cited by examiner

| d1 | d2 | # exps per token | exp token | exp token length | Nnew |
|---|---|---|---|---|---|
| -1 | -1 | 2 | 0000 | 4,0 | e1+4, e2 |
| -1 | 0 | 2 | 0001 | 4,0 | e1+4, e2 |
| -1 | +1 | 2 | 0010 | 4,0 | e1+4, e2 |
| 0 | -1 | 2 | 0011 | 4,0 | e1+4, e2 |
| 0 | 0 | 2 | 0100 | 4,0 | e1+4, e2 |
| 0 | +1 | 2 | 0101 | 4,0 | e1+4, e2 |
| +1 | -1 | 2 | 0110 | 4,0 | e1+4, e2 |
| +1 | 0 | 2 | 0111 | 4,0 | e1+4, e2 |
| +1 | +1 | 2 | 1000 | 4,0 | e1+4, e2 |
| -2 | X | 1 | 1001 | 4 | e1+4 |
| -1 | X | 1 | 1010 | 4 | e1+4 |
| 0 | X | 1 | 1011 | 4 | e1+4 |
| +1 | X | 1 | 1100 | 4 | e1+4 |
| +2 | X | 1 | 1101 | 4 | e1+4 |
| <-2, >+2 | X | 1 | 111abcde* | 8 | e1+4 |

* abcde = {0,1,2,...,20,31} → ABS_EXP = {0,2,3,...,31,32}

Figure 19

| Header Bits | Header Field Names | Comments |
|---|---|---|
| HDR[11:0] | SYNC | 0x97F |
| HDR[21:12] | ATTEN | 10-bit attenuator setting |
| HDR[23:22] | DERIV | 0 = no deriv, 1 = 1st deriv, 2 = 2nd deriv, 3 = 3rd deriv |
| HDR[25:24] | INT_OR_FLOAT | 0 = INT, 1 = 32-bit FLOAT, 2 = 64-bit FLOAT |
| HDR[31:26] | reserved | |
| HDR[47:32] | Optional MAX_EXP | ONLY for floats |

Figure 24

| TOKEN8 (2564) | EXP1_2 (2566) | EXP_DIFF1 (2575) | EXP_DIFF2 (2576) | ABS_EXP (2571) | EXP_SEL (2572) | TOK_LEN (2562) |
|---|---|---|---|---|---|---|
| 0000xxxx | 1 | -1 | -1 | X | 1,2 | 4,0 |
| 0001xxxx | 1 | -1 | 0 | X | 1,2 | 4,0 |
| 0010xxxx | 1 | -1 | +1 | X | 1,2 | 4,0 |
| 0011xxxx | 1 | 0 | -1 | X | 1,2 | 4,0 |
| 0100xxxx | 1 | 0 | 0 | X | 1,2 | 4,0 |
| 0101xxxx | 1 | 0 | +1 | X | 1,2 | 4,0 |
| 0110xxxx | 1 | +1 | -1 | X | 1,2 | 4,0 |
| 0111xxxx | 1 | +1 | 0 | X | 1,2 | 4,0 |
| 1000xxxx | 1 | +1 | +1 | X | 1,2 | 4,0 |
| 1001xxxx | 0 | -2 | X | X | 0 | 4 |
| 1010xxxx | 0 | -1 | X | X | 0 | 4 |
| 1011xxxx | 0 | 0 | X | X | 0 | 4 |
| 1100xxxx | 0 | +1 | X | X | 0 | 4 |
| 1101xxxx | 0 | +2 | X | X | 0 | 4 |
| 111abcde | X | X | X | abcde* | 2 | 8 |

\* abcde = {0, 1, 2, ..., 20, 31} → ABS_EXP = {0, 2, 3, ..., 31, 32}

Figure 26

```
700 ─── void encode (long *intPtr,long *outPtr,short N,int8 *atten,int8 *deriv)
         701a  701b  701c   701d    1880
      {
805 ─── startPtr = outPtr;
705 ─── V_PACK_HDR(atten,deriv);
800
710 ─── R4 = VLOAD(atten);
       V_ENC_DERIV(deriv);
810 ─── do (i=0;i<1;i++)
       {
815 ─── R1 = V_LOAD (intPtr++);
820 ─── R1 = V_MPY(R1,R4);
940a ── R2 = V_DERIV(R1,1);
940b ── R3 = V_DERIV(R2,1);
817 ─── R5 = V_EXPMAX(Re)
720 ─── V_PACK_REG(Re,R5);
725 ─── V_WRITE_IF_FULL(outPtr);
       }
730 ─── V_FLUSH(outPtr);
735 ─── V_UPDATE_DERIV(deriv);
825 ─── pktLen = outPtr - startPtr;
830 ─── pktDif = targetPktLen - pktLen;
740 ─── V_UPDATE_ATTEN(atten,pktDif);
840 ─── return
       }
```

Alternative 1a:
```
       R1 = V_LOAD(inPtr);
745 ── V_RR (R1,R2,R3,R4,R5);
750 ── V_PACK_WRITE(R3,R5, Re, outPtr);
```

Alternative 1b:
```
       R1 = V_LOAD(intPtr);
755 ── V_ENCODE(atten, outPtr);
```

Alternative 2:
```
       pktLen = outPtr - startPtr;
760 ── V_UPDATE_PARAMS(deriv,atten,pktLen);
```

Figure 31

```
900 ──── void decode (long *intPtr, long *outPtr, long N)
              901a    901b    901c
         {
905 ──── V_INIT_DECODE(intPtr);
910 ──── V_DECODE_HDR(intPtr, atten, deriv);
800 ────
812 ──── R4 = V_LOAD(1.0/atten);
         While (N > 0)
                    921
915 ──── {
920 ────     R3 = V_FETCH_EXP;
925a ───     R3 = V_DECODE_EXP (R3, nExps);
930a ───     R2 = V_DECODE_MANTS(R3, 1);
820a ───     R1 = V_INTEG_N(R2, deriv);
850a ───     R1 = V_MPY(R1, R4);
860a ───     V_STORE(R1, outPtr);
             N = N - 1;
924 ────     if (nExps == 2)
925b ───     {
                  R2 = V_DECODE_MANTS(R3, 2);
930b ───          R1 = V_INTEG_N(R2, deriv);
820b ───          R1 = V_MPY(R1, R4);
850b ───          V_STORE(R1, outPtr);
860b ───          N = N - 1;
             }
         }
730 ──── V_FLUSH(inPtr);
840 ──── return;
         }
```

```
┌─ Alternative 1: ──┐
│                   │
935 ── V_FD_EXP;    │
940 ── V_REGEN(outPtr);│
└───────────────────┘

┌─ Alternate 2: ────┐
│                   │
945 ── V_DECODE(outPtr);│
└───────────────────┘
```

Figure 32

```
_macro_decode = V_INTEG_N (register Ra, register Rb, register Rc, short deriv)
{
    switch (deriv)
    {
        case 0: Rb = Ra;                    return;
        case 1: Rb = V_INTEG(Ra);           return;         ─ 141a
        case 2: Rb = V_INTEG(Ra);                          ─ 141b
                Rc = V_INTEG(Rb);           return;         ─ 141c
        otherwise: return V_LOAD(ERROR);
    }
    return 0;
}
```

| Element | Lossless Mode Instruction | Fixed Quality Mode Instruction | Fixed Rate Mode Instruction |
|---|---|---|---|
| 800 | R4 = V_LOAD(#1.0); | R4 = V_LOAD(atten); | R4 = V_LOAD(atten); |
| 825 | | | PktLen = outPtr - startPkt; |
| 830 | | | Pktdif = targetPktLen - PktLen; |
| 740 | | | V_UPDATE_ATTEN(atten, PktDif); |

Figure 34

```
740 ─── void V_UPDATE_ATTEN(uint *atten, int pktDif)
        {
            const short mu = 0.25;
            *atten = *atten + (mu * pktDif);
            return;
        }
```

Figure 35

| Element Number | New SIMD Instruction | Description | Related Figure(s) |
|---|---|---|---|
| 705 | V_PACK_HDR | Pack various encoding parameters into block header. | 20, 21, 23, 24, 31 |
| 710 | V_ENC_DERIV | Specifies which data stream (original samples, first derivative, second derivative, etc.) to encode. | 7, 18, 31 |
| 940a, b | V_DERIV | Generate derivatives of operands in a SIMD register. | 6, 7, 8, 9, 20, 21, 31 |
| 817 | V_EXPMAX | Calculate maximum exponent of N exponents. | 12, 18, 31 |
| 720 | V_PACK_REG | Pack N operands according to maximum exponent | 18, 20, 31 |
| 725 | V_WRITE_IF_FULL | If one double-buffer output registers is full, write its contents to the encoded output array. | 20, 21, 31 |
| 730 | V_FLUSH | If a double-buffered output register is partially full, increment the packed array pointer (outPtr). | 21, 31, 32, 37 |
| 735 | V_UPDATE_DERIV | Update the "best" derivative for the next compressed block, based on minimum accum. 150a, 150b, or 150c. | 31 |
| 740 | V_UPDATE_ATTEN | ONLY during fixed-rate encoding mode, update the attenuator setting for the next compressed block. Attenuation value remains fixed at 1.0 for lossless mode and remains fixed at initial value for fixed quality mode. | 31 |
| 745 | V_RR | Combination of V_MPY, V_DERIV (qty2), and V_EXPMAX. | 31 |
| 750 | V_PACK_WRITE | Combination of V_PACK_REG and V_WRITE_IF_FULL. | 31 |
| 755 | V_ENCODE | Combination of V_RR and V_PACK_REG. | 31 |
| 760 | V_UPDATE_PARAMS | Combination of V_UPDATE_DERIV and V_UPDATE_ATTEN | 31 |

Figure 36

| Element Number | New SIMD Instruction | Description | Related Figure(s) |
|---|---|---|---|
| 905 | V_INIT_DECODE | Initialize internal decoder parameters, including a register pointing to the first bit of the encoded array (begin encoding here). | 23, 32 |
| 910 | V_DECODE_HDR | Unpack the block header bits and initialize decoder registers based on block header parameters. | 22, 32 |
| 915 | V_FETCH_EXP | Fetch the next exponent token (4 or 8 bits) | 22, 25, 26, 32 |
| 920 | V_DECODE_EXP | Decode the leading 8 bits of the packed input bit stream and return variables to the Bit Fetcher and Mantissa Unpacker blocks. | 22, 25, 26, 32 |
| 925a, b | V_DECODE_MANTS | Decode the leading N*N_EXP bits of the packed input bit stream, performing sign extension (for ints) or zero filling (for floats), and deinterleave the nibbles into N operands. | 22, 27, 28, 29, 32 |
| 930a, b | V_INTEG_N | Integrate the unpacked mantissas 0, 1, or 2 times based on the derivative setting for this block. | 32, 33 |
| 141a - c | V_INTEG | Integrate four consecutive operands in a SIMD register. | 5, 33 |
| 730 | V_FLUSH | Increment pointer to the packed array | 31, 32 |
| 935 | V_FD_EXP | Combination of V_FETCH_EXP and V_DECODE_EXP. | 22, 32 |
| 940 | V_REGEN | Combination of V_UNPACK_MANTS, V_INTEG_N, V_MPY, and V_STORE. | 5, 27, 32 |
| 945 | V_DECODE | Combination of V_FD_EXP and V_REGEN. | 22, 32 |

Figure 37

DATA COMPRESSION AND DECOMPRESSION USING SIMD INSTRUCTIONS

BACKGROUND

The technology described herein relates to encoding and decoding of numerical data, using specialized single instruction multiple data (SIMD) instructions for efficient storage and/or transfer of encoded data in a computing system.

In present high performance computing applications, it is often necessary to transfer vast amounts of numerical data among multiple processor cores or between processor cores and memory. The limited data transfer rates of interfaces among processor cores and between cores and memory devices can create bottlenecks for overall data processing speed and performance. In data rich applications, storage of numerical data challenges memory resources and storage devices. Reducing the demands on data transfer and storage capacity for numerical data can improve the efficiency, economy and performance of the computing system. Compression of numerical data may reduce these demands, however at the cost of additional computations. In applications having vast quantities of numerical data, it is especially important that the compression be computationally efficient in order to minimize demands on computing resources.

In present microprocessor architectures, single instruction, multiple data (SIMD) processing performs the same operation indicated by a single instruction on multiple data elements, or operands. A SIMD operation is performed in parallel on the multiple operands, rather than sequentially, thus accelerating computations. Advantages of SIMD implementations include reduced processing time over sequential processing, decreased numbers of instructions and greater processing efficiency. Implementations of SIMD technology are available from many companies, including:

- Intel and AMD, whose SIMD instruction sets are commonly called MMX, SSE, and AVX,
- Advanced RISC Machines (ARM), whose SIMD instruction set is called Neon,
- IBM, Freescale, and Apple, whose SIMD instruction set is called AltiVec, The previous list of SIMD implementations is not meant to be exhaustive, only illustrative that SIMD processing has been widely integrated into microprocessor architectures. Embodiments of the present invention utilize novel SIMD constructs, and defines functionality that may be implemented in new SIMD instructions, to accelerate the process of encoding and decoding a plurality of numerical samples per instruction.

Commonly owned patents and applications describe a variety of compression techniques applicable to fixed-point, or integer, representations of numerical data or signal samples. These include U.S. Pat. No. 5,839,100 (the '100 patent), entitled "Lossless and loss-limited Compression of Sampled Data Signals" by Wegener, issued Nov. 17, 1998. The commonly owned U.S. Pat. No. 7,009,533, (the '533 patent) entitled "Adaptive Compression and Decompression of Bandlimited Signals," by Wegener, issued Mar. 7, 2006, incorporated herein by reference, describes compression algorithms that are configurable based on the signal data characteristic and measurement of pertinent signal characteristics for compression. The commonly owned U.S. Pat. No. 8,301,803 (the '803 patent), entitled "Block Floating-point Compression of Signal Data," by Wegener, issued Apr. 28, 2011, incorporated herein by reference, describes a block-floating-point encoder and decoder for integer samples. The commonly owned U.S. patent application Ser. No. 13/534, 330 (the '330 application), filed Jun. 27, 2012, entitled "Computationally Efficient Compression of Floating-Point Data," by Wegener, incorporated herein by reference, describes algorithms for direct compression floating-point data by processing the exponent values and the mantissa values of the floating-point format. The commonly owned patent application Ser. No. 13/617,061 (the '061 application), filed Sep. 14, 2012, entitled "Conversion and Compression of Floating-Point and Integer Data," by Wegener, incorporated herein by reference, describes algorithms for converting floating-point data to integer data and compression of the integer data. At least a portion of the operations for compression and decompression described in these applications may be implemented using the SIMD technology described in the present specification.

The commonly owned patent application Ser. No. 12/891, 312 (the '312 application), entitled "Enhanced Multi-processor Waveform Data Exchange Using Compression and Decompression," by Wegener, publication number 2011-0078222, published Mar. 31, 2011, incorporated by reference herein, describes configurable compression and decompression for fixed-point or integer numerical data types in computing systems having multi-core processors. In a multi-core processing environment, input, intermediate, and output waveform data are often exchanged among cores and between cores and memory devices. The '312 application describes a configurable compressor/decompressor at each core that can compress/decompress integer or numerical waveform data. The '312 application describes configurable compression/decompression at the memory controller to compress/decompress integer or numerical waveform data for transfer to/from off-chip memory in compressed packets. At least some operations of the configurable compressor and decompressor of the '312 application may be implemented using the SIMD technology described in the present specification.

The commonly owned patent application Ser. No. 13/617, 205 (the '205 application), filed Sep. 14, 2012, entitled "Data Compression for Direct Memory Access Transfers," by Wegener, incorporated herein by reference, describes providing compression for direct memory access (DMA) transfers of data and parameters for compression via a DMA descriptor. The commonly owned patent application Ser. No. 13/616, 898 (the '898 application), filed Sep. 14, 2012, entitled "Processing System and Method Including Data Compression API," by Wegener, incorporated herein by reference, describes an application programming interface (API), including operations and parameters for the operations, which provides for data compression and decompression in conjunction with processes for moving data between memory elements of a memory system. The SIMD instructions described herein may be implemented for the compression and decompression operations described in the '205 application and the '898 application.

In order to better meet the requirements of higher speed data transfer, reduced memory utilization and minimal computation in many computing applications, a need exists for computationally efficient compression and decompression of numerical data using SIMD technology.

SUMMARY

Computational efficiency gained by SIMD implementations of compression of numerical data can provide for more efficient data transfer and memory utilization.

In one aspect, data compression of numerical data may be implemented using resources of a computer system. The data processor of the computer system may execute SIMD instructions that implement at least a portion of the operations for compression of data samples. The operations include determining a maximum exponent value for operands of a first register corresponding to an encoding group of data samples, interleaving bits of the operands to produce a plurality of nibbles to store in a second register, wherein the bits are mapped to a given nibble based on a place value of the bits in respective operands. A subset of nibbles is selected from the plurality of nibbles in the second register, wherein a number of nibbles for the subset is based on the maximum exponent value. The subset of nibbles includes interleaved mantissa bits of the operands. The interleaved mantissa bits of the subset of nibbles are packed in a compressed data packet, wherein the packed interleaved mantissa bits represent compressed data for the encoding group of data samples.

An exponent token may generated to represent the maximum exponent value, an exponent difference between maximum exponent values for a current encoding group and a previous encoding group, or a pair of exponent difference values. The exponent token is stored in the compressed data packet.

In one aspect, the data samples may provide the operands for the first register. In other aspects, redundancy removing operations may be applied to the data samples and the resulting samples are provided as operands to the first register. The redundancy removing operations may include calculating first or higher order derivatives of the data samples and/or attenuating the data samples. One or more of the redundancy removing operations may be implemented using SIMD instructions and registers.

In another aspect, decompression of compressed data may be implemented using resources of a computer system. The data processor of the computer system may execute SIMD instructions that implement at least a portion of the operations for decompression of compressed data. Compressed data stored in a compressed data packet includes exponent tokens and packed interleaved mantissa bits for a plurality of encoding groups. The operations include transferring a plurality of compressed data bits from the compressed data packet to a decode bit register. For processing the exponent tokens, the operations include extracting and decoding an exponent token from the decode bit register to produce at least one decoded exponent value, wherein each decoded exponent value corresponds to a particular encoding group. For processing the packed interleaved mantissa bits, the operations include transferring a portion of the compressed data bits from the decode bit register to a packed mantissa register, the portion including packed interleaved mantissa bits corresponding to the particular encoding group, transferring a subset of nibbles from the packed mantissa register to a first subset of nibbles in a staging register and inserting fill values into a second subset of nibbles in the staging register. The decoded exponent value indicates the number of nibbles from the subset from the packed mantissa register that form the first subset in the staging register. Deinterleaving the bits of the nibbles in the staging register produces a plurality of operands to store in a first register. The deinterleaving maps bits of a given nibble based on a place value of the bits in respective operands. The resulting operands have a data format used by the data processor.

In one aspect, the resulting operands represent decompressed data samples. In other aspects, signal regeneration processing is applied to the operands to produce the decompressed data samples. The signal regeneration operations may include calculating first or higher order integration and/or amplifying the operands. One or more of the redundancy removing operations may be implemented using SIMD instructions and registers.

Other aspects and advantages of the present invention can be seen on review of the drawings, the detailed description and the claims, which follow.

BRIEF DESCRIPTION OF THE DRAWINGS

FIG. 19 shows a preferred exponent encoding table of the exponent token generator for the mapping between the exponent tokens and the exponent difference values or the maximum exponent values.

FIG. 24 describes a configuration for a packet header.

FIG. 26 shows an exponent token decoding table used for operations of the exponent decoder.

FIG. 31 provides an example of pseudo-code SIMD instructions for a program that encodes 4N integer or floating-point samples.

FIG. 32 provides an example of pseudo-code SIMD instructions for a program that decodes compressed data packets to reconstruct 4N integer or floating-point samples.

FIG. 33 further describes the details of the macro V_INTEG_N.

FIG. 34 illustrates additional instructions for the encode function to implement lossless, fixed rate, or fixed quality encoding operations.

FIG. 35 shows instructions for updating the "atten" value during fixed rate operation.

FIG. 36 provides a cross-reference table for the SIMD encoding instructions.

FIG. 37 provides a cross-reference table for the SIMD decoding instructions.

DETAILED DESCRIPTION

Embodiments of the compression and decompression described herein may encompass a variety of computing architectures that represent digital data using a numerical format, referred to herein as numerical data. Numerical data may include both integer data of various bit widths, such as 8 bits, 16 bits, 32 bits, 64 bits, etc. and floating-point data of various bit widths, such as 32 bits, 64 bits, or 128 bits. The numerical data may be generated by a variety of applications and the computing architectures may be general purpose or specialized for particular applications. The numerical data may result from detected data from a physical process, a data created by computer simulation or intermediate values of data processing. For example, the numerical data may arise from analog sensor signals that are converted by an analog to digital converter (ADC) to a digital signal whose samples are represented in a numerical format, typically an integer format. For another example, the digital data may be spatial data points for a simulated computer graphics image in either integer or floating-point format.

Figure 1:
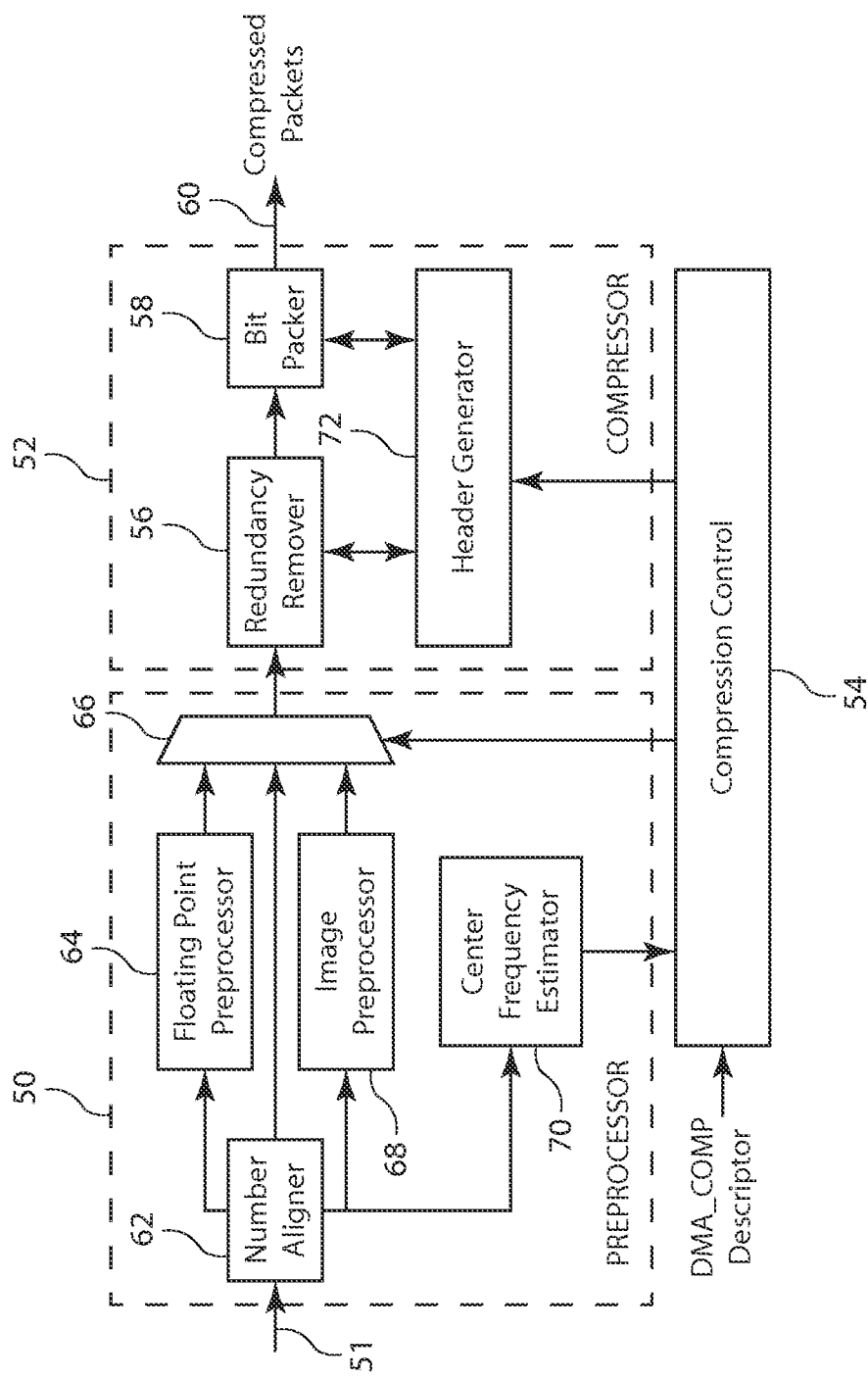
FIG. 1 is a block diagram of logic resources used for implementing compression operations.

FIG. 1 is a block diagram of logic resources used for implementing compression operations. These resources can be implemented as one or more hardware accelerators, provided with the parameters of an API by a corresponding library function implemented by software. Alternatively, some or all of these resources of FIG. 1 can be implemented as software in a library file. Alternatively, the resources can be implemented as a combination of hardware accelerators and software. The compression operations may use SIMD registers and instructions as described herein. In general, the compression resources include a preprocessor block 50 and compressor block 52, with associated control 54. The preprocessor block 50 is adapted for a variety of different data types, including integer data, floating-point data and image data in this example. Numerical data to be preprocessed and compressed are input as represented by line 51, and compressed data packets are output as represented by line 60. In a hardware-accelerated environment, the lines 51 and 60 can correspond to on-chip registers or the data buses. In a software embodiment, lines 51 and 60 can correspond to the data read by or written by the processor that is executing functions for preprocessing and compression. Other embodiments may include a portion of the components of the preprocessor 50 or not include the preprocessor 50.

The preprocessor block 50 includes processes to prepare the input data for the compression operations. These may include a number aligner 62 in embodiments including a hardware accelerator coupled to an internal bus on the integrated circuit. The number aligner 62 aligns samples to be compressed of one width with the internal bus, which may have a different width from that of the samples. In one example, an internal bus may be a 64-bit wide interface to DDR memory (DDR3), while the samples to be compressed are 16-bit integers. In another example, an internal bus may be a 128-bit-wide bus, and the samples to be compressed may be 32-bit single-precision floating-point data. Floating-point samples may be input directly to the selector 66 or converted to an integer format by a floating-point prepreprocessor 64 prior to compression operations. Integer samples may be delivered directly to the selector 66. Image samples are delivered to an image preprocessor 68, which can perform a variety of functions unique to image file encoding, color space conversion, color space decimation, and the like. For some applications, the samples can be delivered to a center frequency estimator 70 which can be applied for sample streams that can benefit from a redundancy removal algorithm that depends on the center frequency of the sample stream. The output of the center frequency estimator 70 is applied to the control block 54, which utilizes the center frequency to generate a "stride" parameter for the redundancy remover, as discussed below.

The inputs to the selector 66 include the output of the floating-point preprocessor 64, the samples delivered directly from the number aligner 62, and the output of the image preprocessor 68. The selector 66 selects the appropriate data stream based on parameters applied by the control block 54 to provide input samples for the compressor block 52. The parameters may be determined from a DMA descriptor compliant with the API delivered to the control block 54.

The compressor block 52 can include a redundancy remover 56 and a bit packer 58. The compressor 52 can implement compression algorithms that can be configured for lossless and lossy compression, in response to parameters provided by the control block 54. A header generator 72 is included with the redundancy remover 56 and the bit packer 58 for use in the assembly of packets to be delivered on line 60, including the compressed data after redundancy removal. Embodiments of the redundancy remover 56 and bit packer 58 using SIMD operations are described with respect to FIG. 18.

The control block 54 controls the routing of the samples through the various logic blocks and applies the parameters of the compression as needed to the various logic blocks. The control block 54 also controls an attenuation factor utilized in some compression modes, to control fixed rate or fixed quality operations, for example, those based on statistics fed back about the characteristics of compressed packets. The control block 54 may receive a DMA descriptor that provides, for instance, data type parameters for the selector 66 and compression parameters for the compressor 52.

Figure 2:
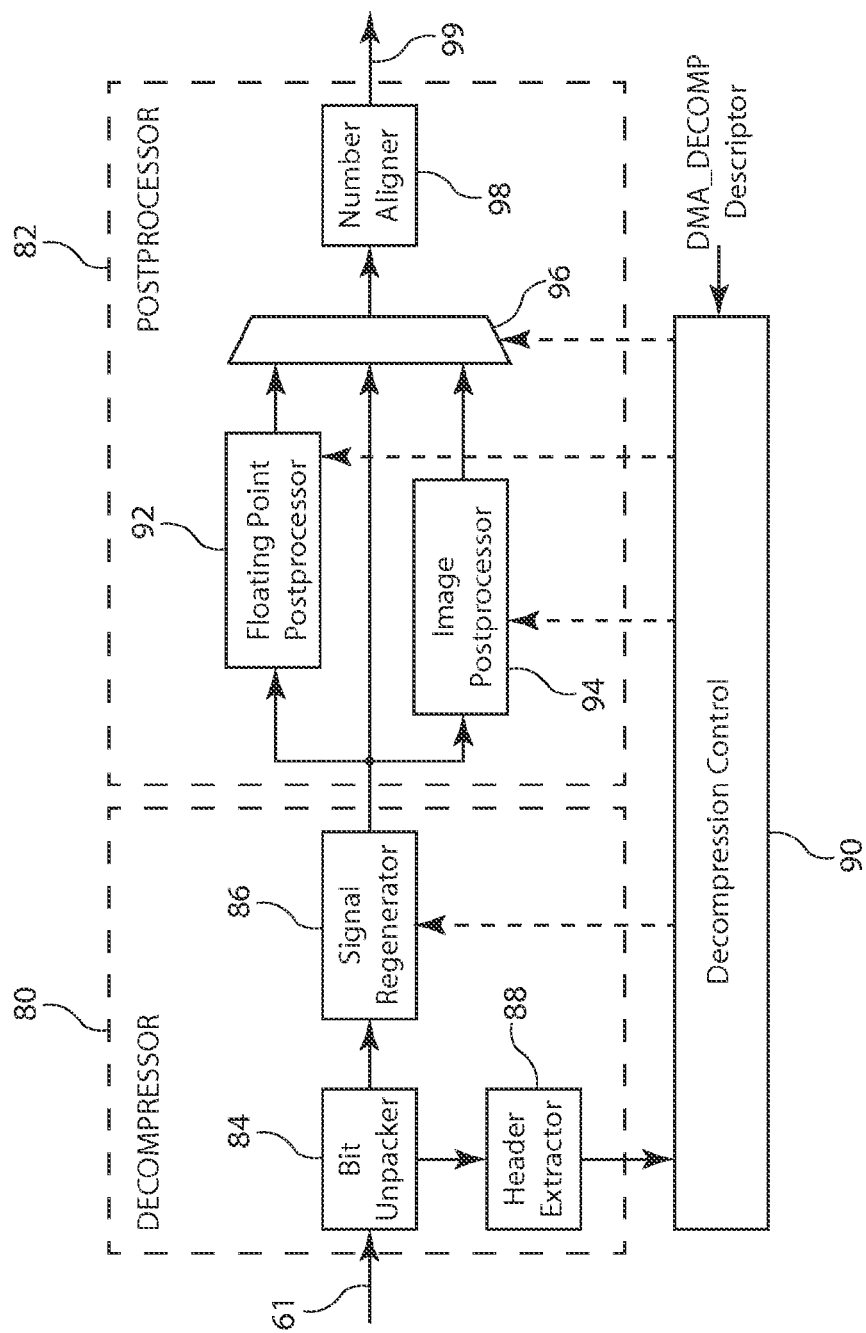
FIG. 2 is a block diagram of logic resources used for implementing decompression operations.

FIG. 2 is a block diagram of logic resources used for implementing decompression operations. These resources can be implemented as a hardware accelerator, provided with parameters of an API by a corresponding library function implemented by software. Alternatively, some or all of these resources of FIG. 2 can be implemented as software in a library file, and used in coordination with other components compliant with the API. Alternatively, the resources can be implemented as a combination of hardware accelerators and software. In general, the decompression resources are complementary to the compression resources described with respect to FIG. 1, and include a decompressor block 80, a postprocessor block 82 and a control block 90. Data packets to be decompressed are input as represented by line 61 and postprocessed, decompressed samples are output as represented by line 99. In a hardware-accelerated environment, the lines 61 and 99 can correspond to on-chip registers or the data buses. In a software embodiment, lines 61 and 99 can correspond to the data read by or written by the processor that is executing library functions. Other embodiments may include a portion of the components of the postprocessor 82 or not include the postprocessor 82.

The decompressor block 80 includes a bit unpacker 84 and a signal regenerator 86 that expand the compressed data to produce decompressed samples. Decompression parameters may be extracted from packet headers by the header extractor 88. The control block 90 provides parameters extracted from the packet headers to the decompressor 80 to configure decompression operations. A DMA descriptor or an API may provide additional parameters, such as data type, to the control block 90. These may be used by the postprocessor to perform appropriate operations.

The bit unpacker 84 and header extractor 88 process the compressed data packet to separate header bits and compressed data bits. The header bits of the packets are extracted and delivered to the control block 90. The parameters from the extracted packet header are used by the control block 90 to control the signal regenerator 86. Embodiments of the bit unpacker and header extractor 88 as described in more detail below with respect to FIGS. 22-24.

The signal regenerator 86 performs inverse operations of the redundancy remover 56. Embodiments of the signal regenerator using SIMD operations are described in further detail below. The output of the signal regenerator 86 is applied to an appropriate unit of the postprocessor block 82. Depending on the incoming data type, the output of the signal regenerator 82 can be routed through the floating-point postprocessor 92, or through the image postprocessor 94. The floating-point postprocessor 92 may perform integer to floating-point format conversion to invert format conversion performed by the floating-point preprocessor 64. The selector 96 is controlled by the control logic 90, in response to the API parameters, DMA descriptor parameters or parameters carried by the packets being decompressed. The inputs to the selector 408 include the output of the floating-point postprocessor 92, the direct output of the signal regenerator 86, or the output of the image postprocessor 94, in this example. The output of the selector 96 is then applied to a number aligner 99 (complementary to that discussed above connection FIG. 1), when necessary, to form the output 99.

Additional aspects of the components shown in FIGS. 1 and 2 are described in the '061 application, the '205 application and the '898 application. In light of the organization of the components shown in FIGS. 1 and 2, some details of the individual components of the compression and decompression functions using SIMD registers and instructions are provided next.

Figure 3:
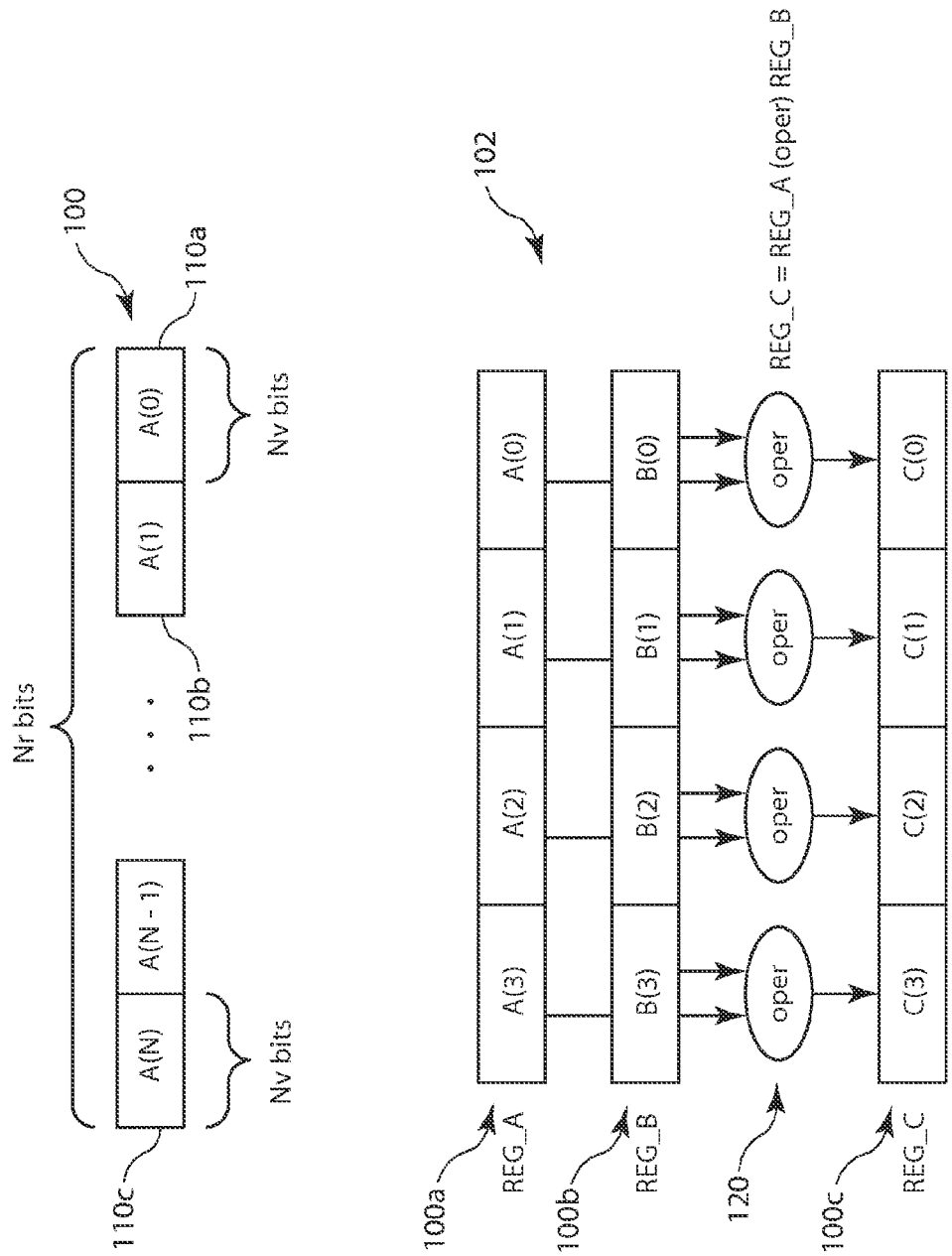
FIG. 3 illustrates the examples of SIMD registers and operations.

FIG. 3 illustrates the examples of SIMD registers and operations. The SIMD register 100 comprises a set on N registers containing numerical data that are operands for an operation specified by a SIMD instruction. The set of N registers of the SIMD register 100 hold numerical data of the same data type. A SIMD instruction specifies the operation to be performed and how the bits in the SIMD register will be interpreted as operands for the operation. For this example, the SIMD register 100 contains N samples, such as the labeled samples A(0) 110a, A(1) 110b, and A(N) 110c. As each operand 110a, 110b, or 110c in SIMD register 100 has a length of Nv bits, the total number of bits Nr in SIMD register is equal to N*Nv. Examples of data types of operands 110a, 110b, and 110c are 8-bit signed or unsigned integers, 16-bit signed or unsigned integers, 32-bit signed or unsigned integers, 64-bit signed or unsigned integers, 32-bit floating-point samples, or 64-bit floating-point samples. Typical values for the SIMD register length Nr are 64 bits (for example, Intel MMX), 128 bits (for example, Intel SSE, SSE2, SSE3), and 256 bits (for example, Intel AVX). Typical values of the operand length Nv are 8, 16, 32, or 64. The SIMD register length Nr and operand length Nv may have other values that differ from these typical values. The number of operands N in a SIMD register is Nr/Nv. Variations in SIMD registers and operands do not limit the scope of the present invention.

FIG. 3 illustrates an example of SIMD operations 102 performed on operands contained in two SIMD registers. In general, SIMD operations are applied in parallel to the multiple operands contained in the SIMD registers. A mathematical, logical, or other operator 120 is applied to the multiple operands contained in one SIMD register REG_A 100a and the multiple operands in a second SIMD register REG_B 100b, with the result being stored in a third SIMD register REG_C 100c. A program for the processor that includes SIMD registers 100a-c may have an instruction for operating on SIMD source registers 100a and 100b, SIMD destination register 100c, and operator 120 in one of several formats, where "operator" indicates the desired mathematical, logical, or other operation (such as addition, subtraction, multiplication, division, etc.), and "dType" indicates the data type of the operands:

REG_C=REG_A (operator, dType) REG_B
opcode(REG_A, REG_B, REG_C, dType)
opcode_dType(REG_A, REG_B, REG_C)
(dType) REG_C=REG_A (operator) REG_B The example instruction formats above are illustrative of a few possible instruction syntaxes that SIMD instruction sets might use to express the same result. Other instruction syntaxes are possible and do not restrict the form of SIMD instructions in embodiments of the present invention. Companies that develop SIMD architectures (such as Intel, AMD, ARM, etc.) often develop their own SIMD instruction set syntax, or they may adopt the instruction syntax of another company. The various SIMD operations described in the present specification will use the following instruction syntax: (dType) REG_C=REG_A (operator) REG_B, where "dType" indicates the data type of the operands 110a, 110b, and 110c, and "operator" indicates the desired operation 120. Typically, but not exclusively, "operator" has a special prefix, suffix, or other label that indicates a SIMD operation. For instance, Intel's SIMD instructions often contain the letters "P" (for parallel) or "V" (for vector) in the operand, to indicate that the instruction is a SIMD instruction. Operations 120 may be unary (one input value, or operand, generates one output value), binary (two input values, or operands, generate one output value), or tertiary (three input values, or operands, generate one output value), although other operators may accept or require other numbers of input operands and may generate other numbers of output results. Operands may also include memory address from which input samples may be read, or a memory address to which output samples may be written. SIMD instructions may also include immediate values (operands whose value is encoded in the instruction) and selection of various options for the SIMD operation.

For example, for addition and subtraction operators, the four operands [B(3) B(2) B(1) B(0)] in SIMD register REG_B 100b are added to (+) or subtracted from (−) the four operands [A(3) A(2) A(1) A(0)] in SIMD register REG_A 100a, resulting in the answer [C(3) C(2) C(1) C(0)] in SIMD register REC_C 100c. In this example:

For addition (+): REG_C=REG_A+REG_B C(3)=A(3)+B(3) C(2)=A(2)+B(2) C(1)=A(1)+B(1) C(0)=A(0)+B(0)

For subtraction (−): REG_C=REG_A−REG_B C(3)=A(3)−B(3) C(2)=A(2)−B(2) C(1)=A(1)−B(1) C(0)=A(0)−B(0)

In many applications, mathematical operations are applied to sequences of samples that represent a waveform that in turn may represent signal samples, such as the output of analog sensors digitized by an analog-to-digital converter (ADC), one or more rasters or color planes of an image, sequences of pixel arrays representing video, etc. As described in the '312 application, sampled data waveforms are often (but not exclusively) obtained by digitizing real-world analog signals such as speech, audio, images, video, or other sensor output signals using an analog-to-digital converter (ADC). Sampled data signals can also be simulated and can either be fed directly, or after additional waveform data processing operations, to a digital-to-analog converter (DAC) in order to generate analog speech, audio, images, or video signals. In this specification, the term "sampled data waveforms" also includes such intermediate and/or final sampled data waveforms generated from mathematical and/or logical operations performed upon input or intermediate sampled data waveforms.

Figure 4:
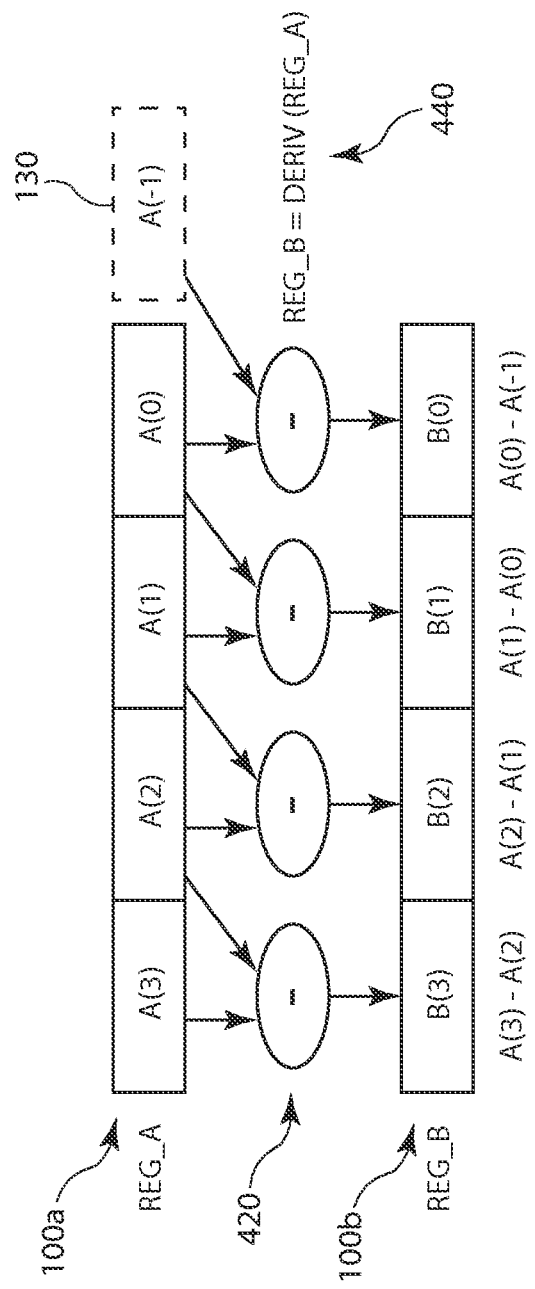
FIG. 4 illustrates SIMD register architecture for subtraction operations useful for sequences of samples, in accordance with a preferred embodiment.

FIG. 4 illustrates a SIMD register architecture for subtraction operations useful for sequences of samples, in accordance with a preferred embodiment. FIG. 4 indicates that a subset of sequential samples [A(3) ... A(−1)], such as from sampled data waveforms, may be stored in SIMD register REG_A 100a and register 130, and that subtractors 420 can be configured to generate a first derivative (also called first difference) of the sequential samples. The SIMD subtractor elements 420 generate differences among adjacent samples to produce derivative samples for REG_B 100b. The SIMD derivative instruction 440, REG_B=DERIV(REG_A) is a useful compression operation. Sample-to-sample correlations may be reduced by taking one or more derivatives of the original sample stream. The derivative samples occupy a smaller dynamic range than did the original sample stream, allowing the signal to be represented using fewer bits than were required to represent the original sample stream.

The SIMD derivative instruction 440 generates the first derivative of a sequence of five samples from SIMD register REG_A and register 130 and stores the result in REG_B 100b:

$$B(0)=A(0)-A(-1)\ B(1)=A(1)-A(0)\ B(2)=A(2)-A(1)$$
$$B(3)=A(3)-A(2)$$

Figure 5:
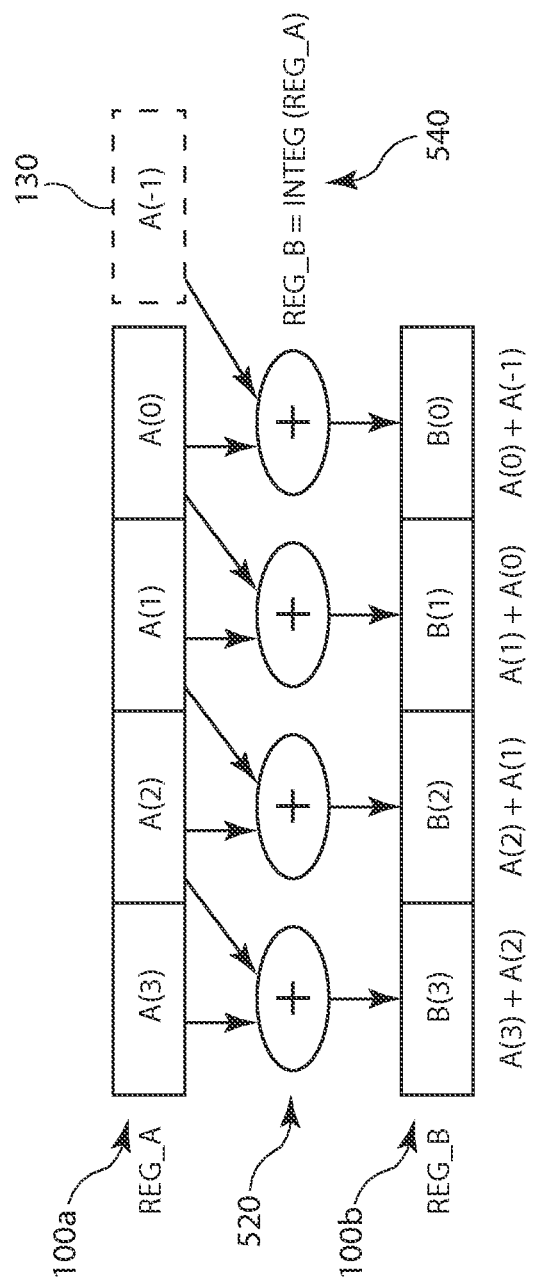
FIG. 5 illustrates SIMD operations to integrate a sequence of samples, in accordance with a preferred embodiment.

FIG. 5 illustrates SIMD operations to integrate (accumulate) a sequence of samples, in accordance with a preferred embodiment. The SIMD integration operation 540 provides an inverse to the SIMD derivative operation 440. The SIMD integration instruction 540 generates the first integral of a sequence of five samples from REG_A 100a and register 130:

$$B(0)=A(0)+A(-1)\ B(1)=A(1)+A(0)\ B(2)=A(2)+A(1)$$
$$B(3)=A(3)+A(2)$$

Figure 6:
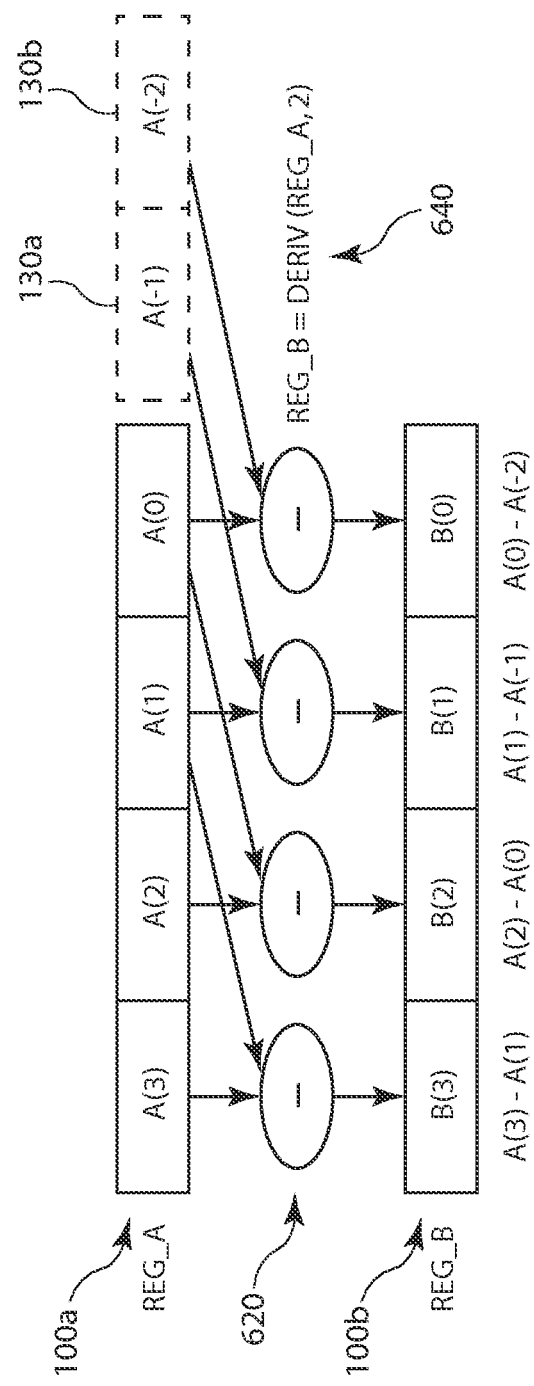
FIG. 6 illustrates extended capabilities of FIG. 4's DERIV instruction, in accordance with a preferred embodiment.

In FIGS. 4 and 5, sample A(−1) is stored in register 130 not in SIMD register REG_A 100a. Alternative embodiments for SIMD registers to store sample A(−1) and its predecessor samples A(−2), A(−3), etc., are described below with respect to FIGS. 7 through 9. FIG. 6 illustrates extended capabilities of FIG. 4's DERIV instruction 440, in accordance with a preferred embodiment. Sometimes sequences of samples are interleaved, i.e. odd and even indices in an array contain samples from two different numerical sequences. In this case, samples with odd indices [A(−1), A(1), A(3), A(5), etc.] are correlated, and samples with even indices [A(0), A(2), A(4), etc.] are correlated with each other. In this case, the DERIV instruction 640 includes an additional parameter called "stride" that indicates the distance between correlated samples in the sequence. FIG. 6 illustrates that the DERIV instruction 640 generates the following differences, using a stride of 2:

$$B(0)=A(0)-A(-2)\ B(1)=A(1)-A(-1)\ B(2)=A(2)-A(0)$$
$$B(3)=A(3)-A(1)$$

For example, in SIMD instruction 640, the stride is indicated as the second parameter to the DERIV instruction: REG_B=DERIV(REG_A, 2).

Figure 7:
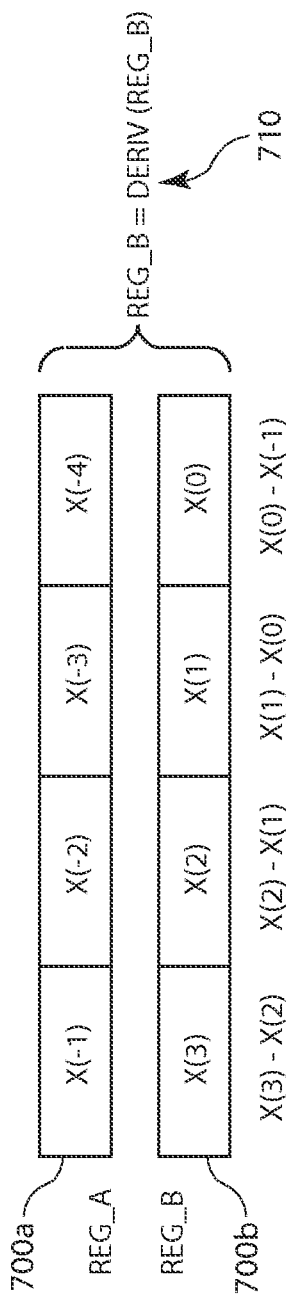
FIG. 7 illustrates a DERIV instruction that implicitly indicates in which SIMD register the earlier samples $x(-1) \ldots x(-4)$ are stored.
Figure 8:
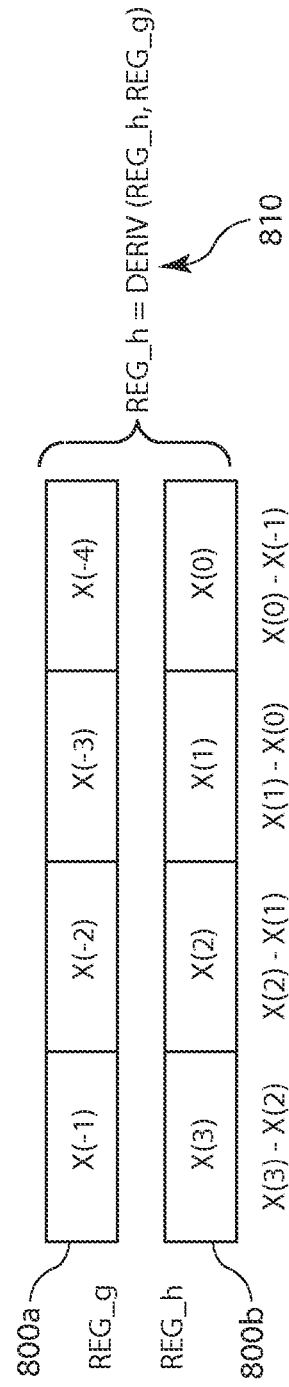
FIG. 8 illustrates an alternative DERIV instruction that explicitly indicates in which SIMD register the earlier samples $x(-1) \ldots x(-4)$ are stored.

FIGS. 7 and 8 illustrate two alternatives for storing sequences of samples for the DERIV and INTEG operations described with respect to FIGS. 4 and 5. FIGS. 7 and 8 illustrate how to generate the first derivative of a sequence of samples {x(−4), x(−3), ... x(2), x(3)}, where x(−4) is the first sample in the sequence and x(3) is the last sample in the sequence. FIG. 7 illustrates a DERIV instruction that implicitly indicates in which SIMD register the earlier samples x(−1) ... x(−4) are stored. The location of earlier samples is indicated implicitly by an implied sequence of register ordering. In implicit register ordering, SIMD registers REG_A, REG_B, REG_C, etc. are implicitly arranged in a sequence, and the DERIV instruction 710 uses this implicit sequence to determine where previous sample x(−1) is stored. In FIG. 7, REG_B 700b holds samples {x(3), x(2), x(1), x(0)}, and because of implicit register ordering (REG_A 700a precedes REG_B 700b), REG_A 700a therefore contains earlier samples {x(−1), x(−2), x(−3), x(−4)}. The SIMD instruction 710 REG_B=DERIV(REG(B)) means that x(−1) is implicitly stored in the left-most operand of SIMD register REG_A (700a).

FIG. 8 illustrates an alternative DERIV instruction that explicitly indicates in which SIMD register the earlier samples x(−1) ... x(−4) are stored, The DERIV instruction 810 (REG_h=DERIV(REG_h, REG_g) is explicitly provided with two register identifiers (REG_g 800a and REG_h 800b), where REG_g 800a contains earlier samples {x(−1), x(−2), x(−3), x(−4)} and REG_h 800b contains samples {x(3), x(2), x(1), x(0)}. Thus the left-most operand of REG_g 800a contains sample x(−1). Analogous alternatives for explicit and implicit SIMD instructions for the integration operation 540 are as follows. The integration operation REG_B=INTEG(REG_B) implicitly indicates the sample order as that of REG_A 700a and REG_B 700b in FIG. 7. The integration operation REG_h=INTEG(REG_h, REG_g) explicitly indicates that REG_g 800a holds the earlier samples {x(−1), x(−2), x(−3), x(−4)} and REG_h 800b holds samples {x(3), x(2), x(1), x(0)} for the integration operations.

Figure 9:
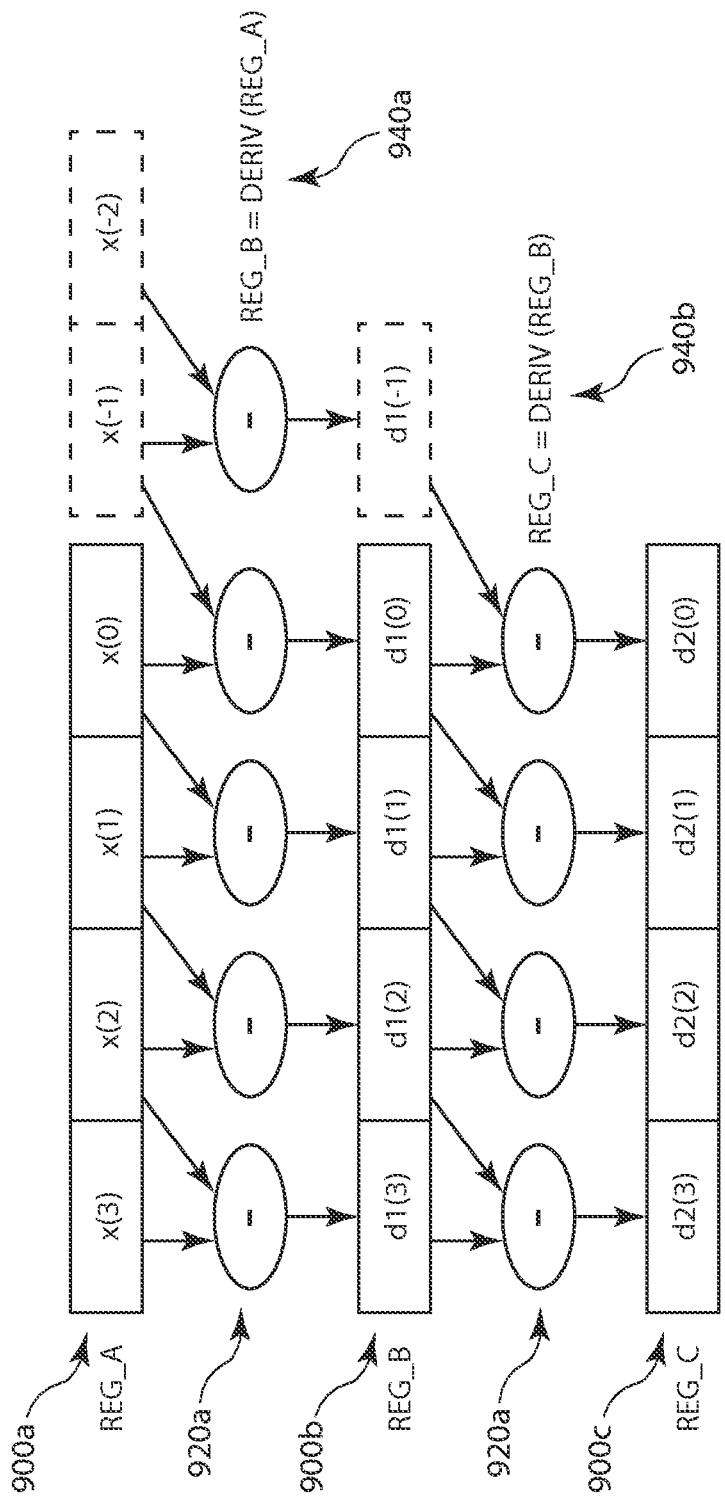
FIG. 9 illustrates calculation of higher-order derivatives (second derivative, third derivative, etc.) using two or more DERIV instructions.

FIG. 9 illustrates calculation of higher-order derivatives (second derivative, third derivative, etc.) using two or more DERIV instructions 940. In FIG. 9, REG_A 900a holds the samples {x(3) ... x(0)}, and another register (not shown in FIG. 9) holds the earlier samples {x(−1), x(−2)}. After the first DERIV instruction 940a [REG_B=DERIV(REG_A)], REG_B 900b contains the first derivative {d1(3) ... d1(0)}. Similarly, after the second DERIV instruction 940b [REG_C=DERIV(REG_B)], REG_C 900c contains the second derivative {d2(3) ... d2(0)}. The SIMD derivative (DERIV) operations for compression may be inverted by the SIMD integration (INTEG) operations for decompression. Successive operations using FIG. 5's INTEG instruction 540 can be used to regenerate {d1(3) ... d(0)} from {d2(3) ... d2(0)}, and to regenerate {x(3) ... x(0)} from {d1(3) ... d(0)}. Thus the SIMD DERIV instruction 940 can reduce the numerical range of a numerical sequence, while the SIMD INTEG instruction 540 can recover the original numerical sequence whose derivatives were generated using one or more DERIV instructions 940. By reducing the numerical range of a sequence of numbers, the sequence can be encoded for transmission or storage using fewer bits. The sequence can be regenerated using the inverse operation when needed for application processing.

Figure 10:
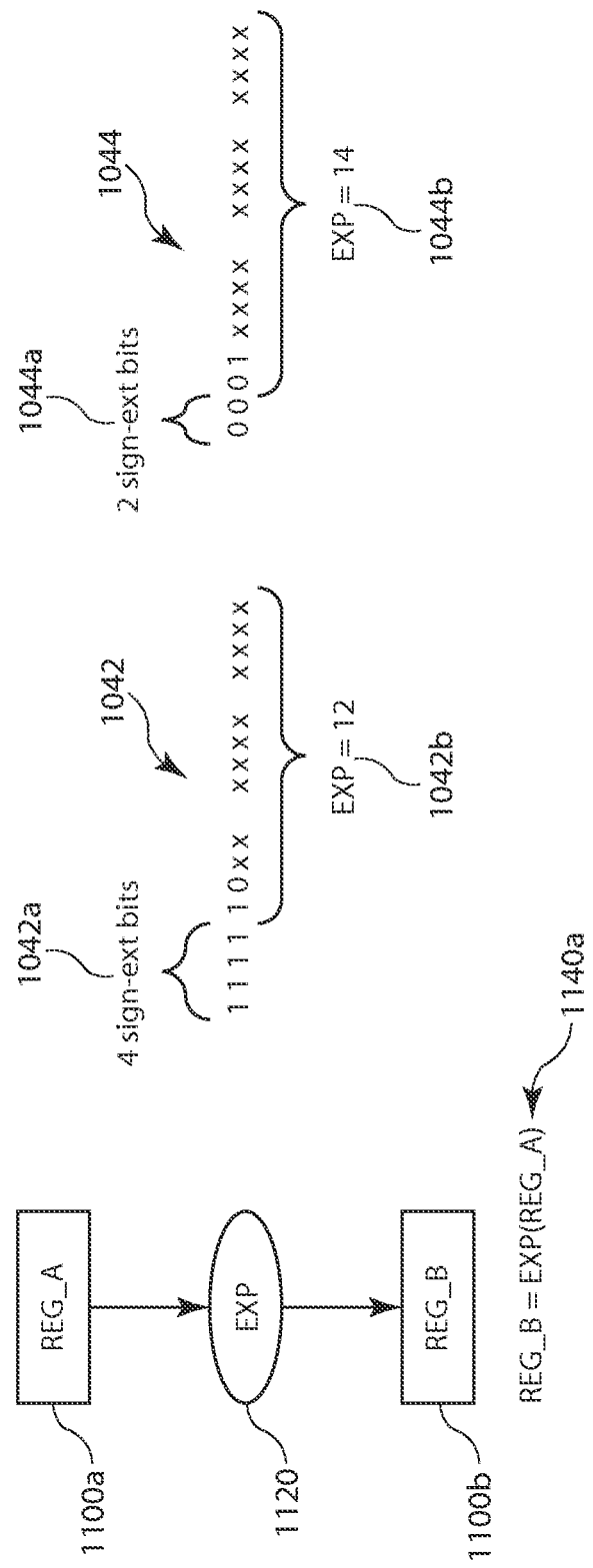
FIG. 10 illustrates determining an exponent for a twos complement representation of numerical data.

FIG. 10 illustrates determining an exponent for a twos complement representation of numerical data. A common format for signed integers is twos complement representation. Twos complement representation contains both magnitude and sign bits; typically the integer's magnitude occupies the lower bits of the integer representation, while the sign bits (and sign extension bits) occupy the upper bits of the integer representation. A first example is a 16-bit integer 1042 with 12 magnitude bits 1042b (a sign bit of 1, followed by a "0" bit, followed by 10 "don't care" x bits) and 4 sign extension bits 1042a, which are copies of the left-most sign bit ("1") of the magnitude field. For this first example, the exponent is 12. A second example is 16-bit integer 1044 having 14 magnitude bits 1044b (a sign bit of 0, followed by a "1" bit, followed by 12 "don't care" x bits) and 2 sign extension bits 1044a, which are copies of the left-most sign bit ("0") of the magnitude field. For the second example, the exponent is 14. Exponent generation logic 1120 determines exponents of input operands from SIMD register 1100a (REG_A) and stores the resulting exponent values in SIMD register 1100b (REG_B). In a preferred embodiment, exponent generation logic 1120 applied to SIMD register 1100a may be implemented using N priority encoders in parallel to encode both leading ones (negative twos complement integers) and leading zeros (positive twos complement integers), where N is the number of operands in the SIMD register 1100a. The priority encoder includes logic that performs exponent calculations on an individual operand. The determined exponent indicates the number of non-sign extension bits that represent the numerical data.

Figure 11:
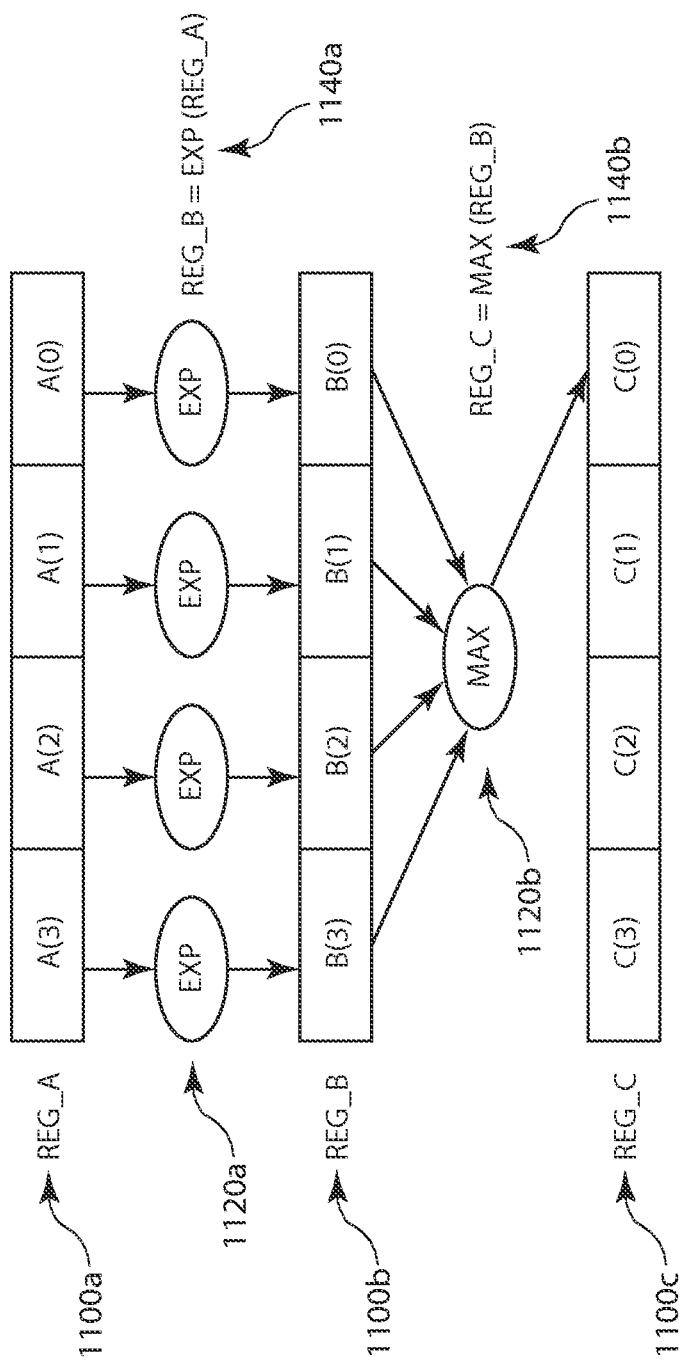
FIG. 11 illustrates a sequence of two instructions for determining a maximum exponent of four SIMD operands.
Figure 12:
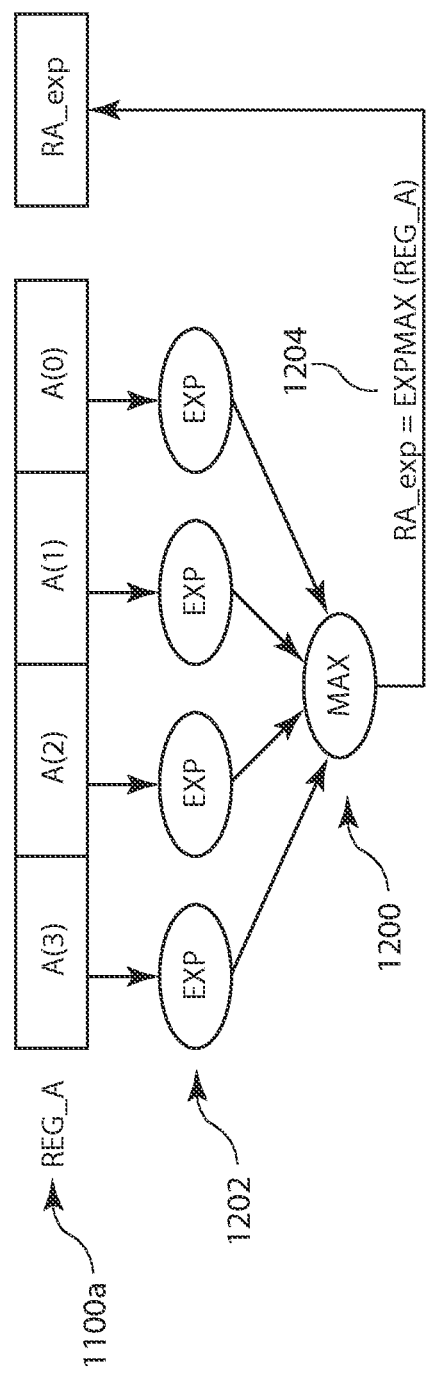
FIG. 12 illustrates a single instruction for determining a maximum exponent of SIMD operands.

FIGS. 11 and 12 illustrate two alternative SIMD instruction sequences that determine maximum exponents of SIMD operands. FIG. 11 illustrates a sequence of two instructions for determining a maximum exponent of four SIMD operands. For this example, the SIMD input register 1100a (REG_A) holds four operands {A(3) ... A(0)}, a first instruction 1140a [REG_B=EXP(REG_A)] calculates four exponents for the four operands in SIMD register 1100a [REG_A], using exponent calculation logic 1120a previously discussed with respect to FIG. 10, and stores the four calculated exponents in SIMD register 1100b [REG_B]. A second instruction 1140b [REG_C=MAX(REG_B)] calculates the maximum exponent from among the four exponents {B(3) ... B(0)} and stores this maximum exponent in the right-most operand C(0) of SIMD register 1100c [REG_C]. FIG. 12 illustrates a single instruction for determining a maximum exponent of SIMD operands. For this example, the SIMD instruction 1204 [RA_exp=EXPMAX(REG_A)] performs the exponent calculations 1202 and maximum exponent calculation 1200 using sequential logic, without saving the four individual exponents in a register. The preferred embodiment for the maximum exponent calculation is SIMD instruction 1204, since a single SIMD instruction is expected to operate faster than two successive SIMD instructions. When register 1100a (REG_A) contains floating-point operands, SIMD maximum exponent operations 1202 and 1204 may be applied to the floating-point exponent bits of the operands to determine the maximum exponent value. For a floating-point data type, a SIMD instruction may determine the maximum floating-point value of the floating-point operands. An additional SIMD instruction may normalize to normalize the floating-point samples based on the maximum floating-point value or maximum floating-point exponent value. As described above, the data type having Nv bits per operand and SIMD register length Nr determines the number of operands N in the SIMD register. For some data types, maximum exponent values may be calculated for subsets of the N operands in the SIMD register. For example, eight operands may be divided into two subsets of four operands, and the maximum exponent determined for each subset. The instruction syntax may include a "dType" to indicate the data type of the operands, as described above. While the preferred number of operands for maximum exponent determination is four, other numbers of operands are also possible.

The maximum exponent, or block exponent, is used for efficient encoding and packing of the group input samples from register 1100a (REG_A), as further described below. The maximum exponent, or block exponent, corresponds to a group of samples referred to herein as an encoding group. For the examples of FIGS. 11 and 12, the SIMD register 1100a holds four samples for the encoding group corresponding to the maximum exponent.

The SIMD instructions described above may be used in a computer program for removing redundancy from numerical data. The redundancy removal operations reduce the dynamic range of numerical input operands. The exponent calculation instructions determine the number of relevant bits, or block exponent for an encoding group of the range-reduced samples. The block exponent for the encoding group is used for efficient bit packing operations to form compressed data packets.

Figure 13:
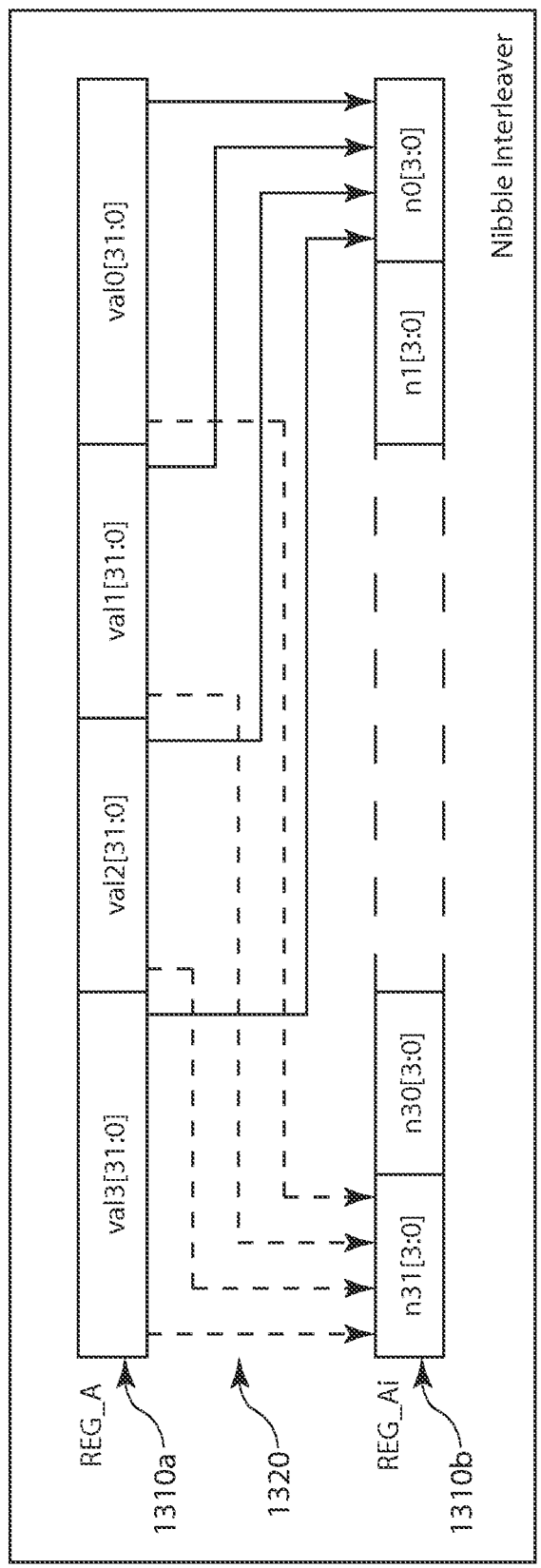
FIG. 13 illustrates a nibble interleaver in accordance with one embodiment.

FIG. 13 illustrates a nibble interleaver 1320 in accordance with one embodiment. A "nibble" holds 4 bits. The SIMD register 1310a [REG_A] contains four 32-bit samples {val3, val2, val1, val0} for this example. The nibble interleaver reorganizes the bits of each sample in REG_A 1310a based on the bit's place value to form nibbles stored in REG_Ai 1310b. For example, when REG_A 1310a stores four 32-bit samples, each nibble contains one bit from each sample according to place value to form 32 nibbles, n0 to n32, for REG_Ai 1310b. Preferably, the nibbles are arranged sequentially from the least significant bits for the least significant (right-most) nibble to the most significant bits for the most significant (left-most) nibble in REG_Ai 1310b. The example of FIG. 13 shows that the least significant bit (bit[0]) of {val3, val2, val1, val0} are stored sequentially in the lowest nibble of SIMD register 1310b [REG_Ai], where the "i" suffix indicates "interleaved."

The nibble interleaver 1320 may also be applied to operands whose bit width is other than 32 bits. For the SIMD register length of 128 bits (for example, Intel SSE, SSE2, SSE3), at least the following combinations are possible:
  Interleave four 32-bit samples as 32 4-bit nibbles (as shown in FIG. 13)
  Interleave eight 16-bit samples as 16 bytes (8 bits per byte)
  Interleave sixteen 8-bit samples as 8 shorts (16 bits per short)
  Interleave two 64-bit samples as 32 4-bit nibbles, where each nibble contains 2 bits from each of the two samples.

For a SIMD register length of 256 bits (for example, Intel AVX), at least the following combinations are possible:
Interleave four 64-bits samples as 64 4-bit nibbles
Interleave eight 32-bit samples as 32 bytes
Interleave sixteen 16-bit samples as 16 shorts
Interleave two 128-bit samples as 64 4-bit nibbles, where each nibble contains 2 bits from each of the two samples.

A preferred implementation of the nibble interleaver network 1320 may use wires connecting the bit locations of the register 1310a to the appropriate locations in register 1310b to produce the sequential order of nibbles as shown in FIG. 13. This implementation has the advantage of minimizing delay for the interleaving operation. A useful feature of nibble interleaver is that its operation can be performed entirely using wires, such as by nibble interleaving network 1320, rather than combinatorial logic (transistors). In system-on-chip (SoC) implementations, which are also called application-specific integrated circuits (ASICs), transistors and wires are combined to create the functional elements of integrated circuits. An attractive feature of implementing nibble interleaving using wires is that they require significantly less delay than cascades of combinatorial logic elements (transistors). A nibble interleaver implemented using only the wires of nibble interleaving network 1320 will operate both faster and with lower latency than an alternate implementation that uses combinatorial logic elements.

The bit packing operations described below include selecting subset of bits from samples to be packed. The sequential order of nibbles allows simpler operations for selecting a subset of bits from the register 1310b REG_Ai for bit packing operations.

Ordinarily, selecting four M-bit subsets of the four 32-bit samples {val3, val2, val1, val0} would require several circuits called masking circuits and barrel shifters. Masking circuits typically clear (set to 0) one or more bits of an input operand; masking circuits can optionally clear either the Nmask most significant bits or Nmask least significant bits of an input operand. Barrel shifters are relatively complex devices that position input operands in one of several output bit locations by shifting the input operands to the left (up-shifting) or to the right (down-shifting).

An alternate implementation for bit packing that may employ masking circuits and barrel shifters. For example, the alternative implementation could pack the four operands {val3, val2, val1, val0} of SIMD register 1310a [REG_A] (with example exponent 19) into SIMD register 1310b [REG_Ai] in the following way:
Val0[18:0] REG_Ai[18:0]
Val1[18:0] REG_Ai[37:19]
Val2[18:0] REG_Ai[56:38]
Val3[18:0] REG_Ai[75:57]

Interleaving the bits in this manner requires the following masking and bit shifting operations:
A masking of the upper 13 bits of val0 and transfer to REG_Ai[18:0]
A masking of the upper 13 bits of val1, a 13-bit right-shift of val1, and transfer to REG_Ai[37:19],
A masking of the upper 13 bits of val2 and a 26-bit right-shift of val2, and transfer to REG_Ai[56:38],
A masking of the upper 13 bits of val3 and a 39-bit right-shift of val3, and transfer to REG_Ai[75:57], These masking and shifting operations require significant combinatorial logic that introduces latency between REG_A 1310a and REG_Ai 1310b.

In contrast, the preferred implementation for the nibble interleaver groups the input bits in a different order based on place value (as illustrated in FIG. 13's REG_Ai 1310b), using only wires. For the bit packing example, a subset of 75 sequential bits may be selected from in REG_Ai[75:0]. In the design of SoC and ASIC devices, faster speed and lower latency are preferable features. The preferred implementation of the nibble interleaver 1320 can operate significantly faster, and with less latency, than an alternate bit packer implemented using masking circuits and barrel shifters.

In a preferred embodiment for bit packing operations, a subset of bits is selected from the interleaved bits of REG_Ai 1310b. The selection operation may depend upon the data type of operands in SIMD input register.

Figure 14:
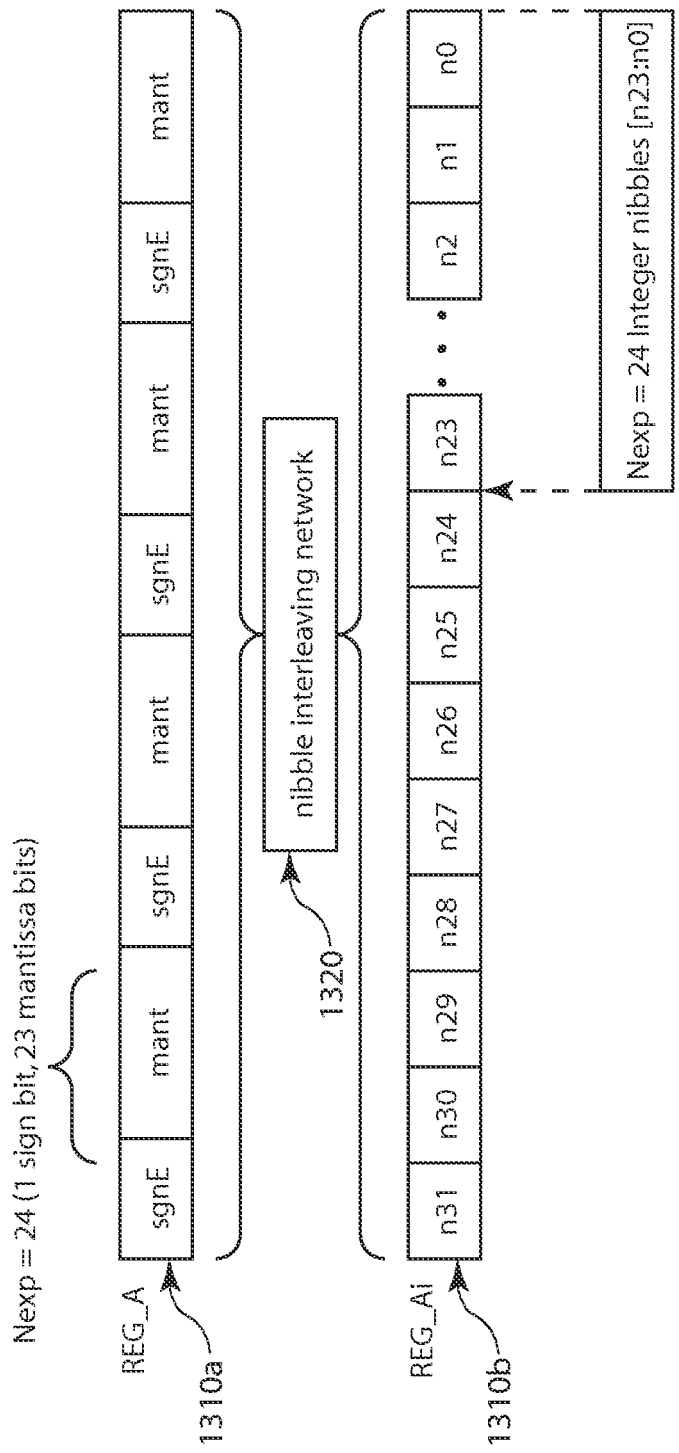
FIG. 14 illustrates one example of interleaving and selecting when the operands are signed twos complement integers.

FIG. 14 illustrates one example of interleaving and selecting when the operands are signed twos complement integers. The SIMD register REG_A 1310a contains four 32-bit operands having the sign and sign extension bits indicated by "sgnE" and mantissa bits indicated by "mant". The variable Nexp specifies the number of bits to be saved for each sample. For this example, Nexp=24, including one sign bit and 23 mantissa bits. Twos complement arithmetic generates additional sign extension bits that are stored in the most significant (left-most) nibbles of each sample in SIMD register 1310a [REG_A]. The bits to be stored during bit packing of nibble-interleaved SIMD register 1310b [REG_Ai] are the Nexp least significant (right-most) nibbles. For this example, Nexp=24 least significant nibbles, n0 to n23, are selected for packing. The subset including the Nexp right-most nibbles of SIMD register REG_Ai 1310b correspond to selecting Nexp bits, including one sign bit and Nexp-1 mantissa bits, from each operand in SIMD register REG_A 1310a. The number of nibbles to be packed, Nexp, may be calculated for each group of SIMD register operands using the technique described with respect to FIG. 10.

Figure 15:
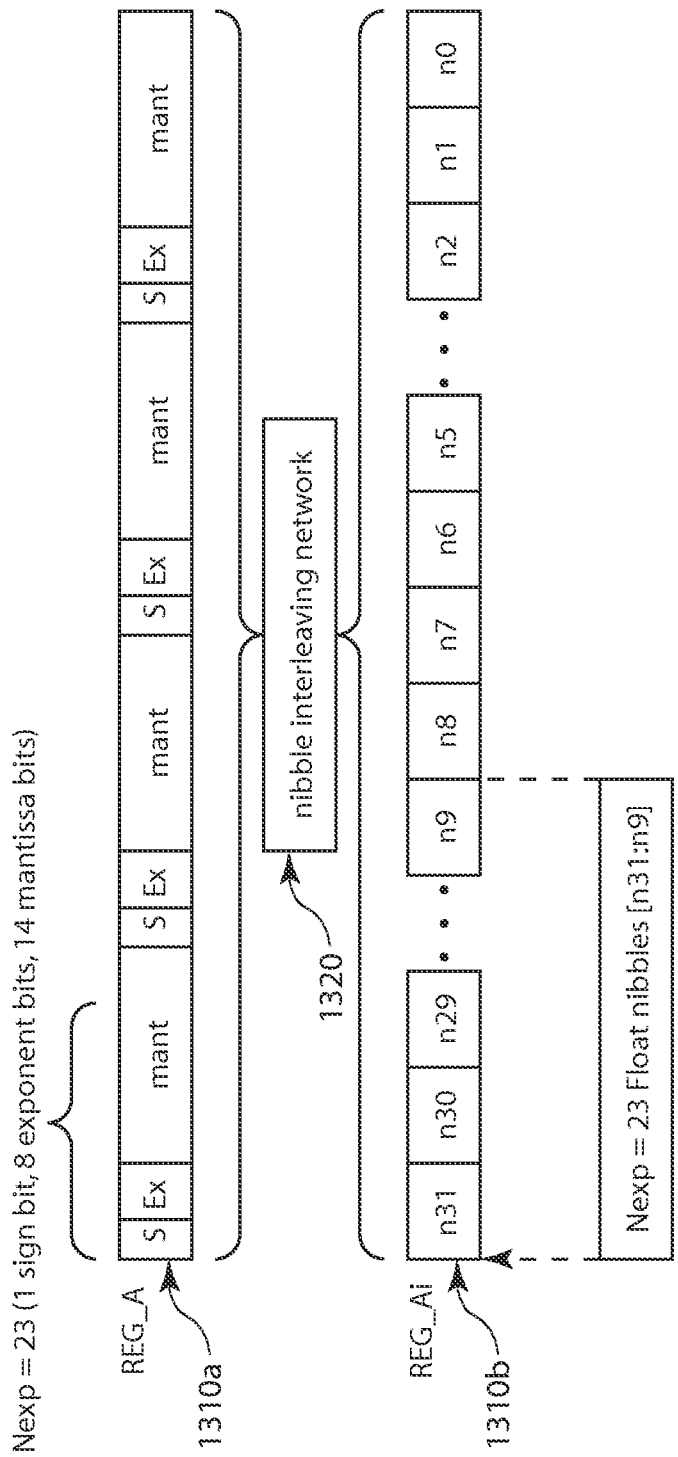
FIG. 15 illustrates an example of interleaving and selecting when the operands are single-precision floating-point samples.

FIG. 15 illustrates an example of interleaving and selecting when the operands are single-precision floating-point samples. The SIMD register 1310a [REG_A] contains four 32-bit single-precision floating-point samples, each including a sign bit "s", floating-point exponent bits "ex" and mantissa bits "mant". For example, the IEEE-754 Standard for Floating-Point Arithmetic, specifies floating-point one sign bit (bit 31 of [31:0]), 8 exponent bits (bits [30:23]), and 23 mantissa bits (bits [22:0]). Packing the left-most (most significant) nibbles of SIMD register 1310b using nibble interleaving network 1320 maintains each floating-point operand's sign bit, one or more of each floating-point operand's exponent bits, and some number of each floating-point operand's most significant (left-most) mantissa bits. The number of nibbles to be packed is specified by Nexp. For the example of FIG. 15, the Nexp=23 left-most bits of each sample are to be saved for bit packing, including one sign bit, 8 exponent bits and 14 mantissa bits. The subset including the Nexp=23 most significant (left-most) nibbles of the SIMD register 1310b correspond to selecting Nexp bits from each operand in SIMD register 1310a. For floating-point samples, Nexp may be chosen to achieve a desired user-specified or data-dependent numerical quality after decoding (decompression), or to achieve a desired user-specified or data-dependent compression ratio after encoding (compression). The larger Nexp, the higher the quality of the decoded (decompressed) result, but the lower the encoded (compressed) compression ratio. The '330 application, entitled "Computationally Efficient Compression of Floating-Point Data," describes methods for determining the number of mantissa bits to encode for floating-point samples.

Figure 16:
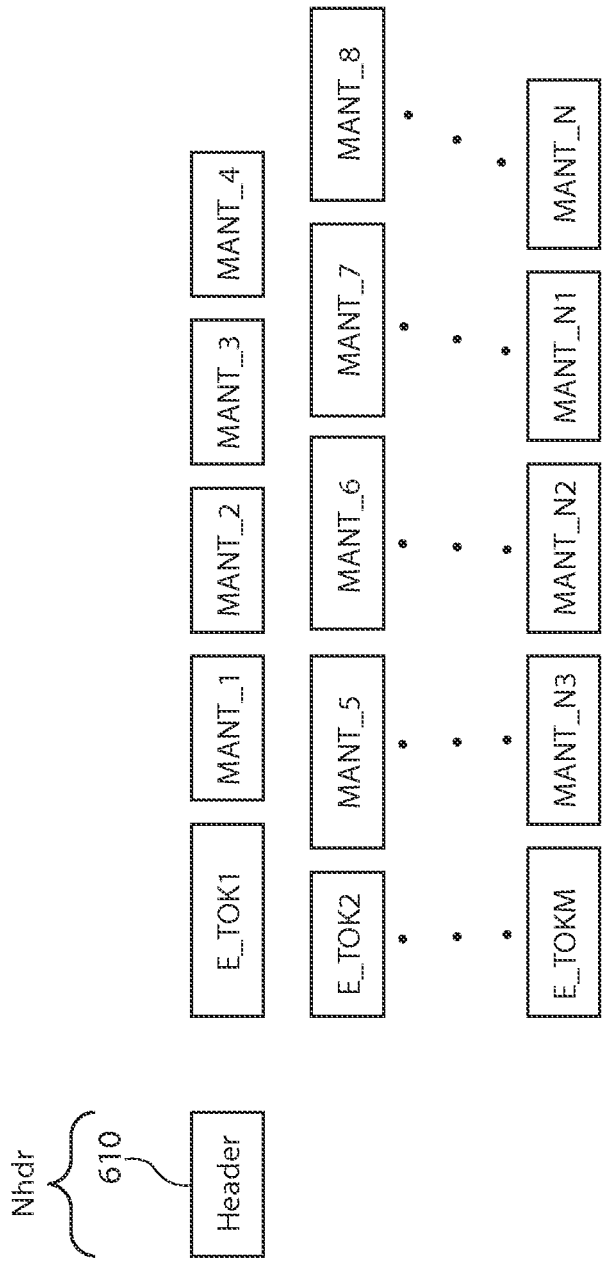
FIG. 16 illustrates one configuration for a compressed data packet.

FIG. 16 illustrates one configuration for a compressed data packet. Block floating-point encoding applied to encoding groups of samples provides the exponent tokens E_TOK1–E_TOKM and mantissa tokens MANT_1–MANT_N. For this example, one exponent token E_TOK represents the block exponent for four mantissas of the encoding group. Each floating-point encoding group of four mantissa tokens has the same number of bits indicated by the value of the block exponent. The exponent token E_TOK for each group of four mantissas represents that group's exponent, or its exponent difference from the previous exponent. The first exponent token E_TOK1 will be encoded absolutely, that is, the block exponent value is saved directly to the compressed data packet. In a preferred embodiment, the first exponent token is represented using eight bits, so that exponent values from 0 to 255 may be represented. Subsequent block exponents are encoded by encoding the difference between the previous block exponent and the current block exponent. For example, if the block exponent sequence for six encoding groups are {10, 9, 8, 10, 11, 12}, the six block exponents would be encoded with the sequence {10, −1, −1, +2, +1, +1}. Because exponent differences often fit into a small range (such as the range −2 to +2), exponent differences can be encoded using fewer bits than by encoding each exponent absolutely, i.e. using 8 bits. Thus block exponents may be encoded using exponent tokens that represent the exponent differences, rather than the block exponents themselves. In the configuration of FIG. 16, each exponent token E_TOK is followed by the four mantissa tokens MANT_i of the encoding group. For example, exponent token E_TOK1 is followed by mantissa tokens MANT_1, MANT_2, MANT_3, MANT4 and exponent token E_TOK2 is followed by the four mantissa tokens MANT_5, MANT_6, MANT_7, MANT_8. The compressed data packet may include a header 610 containing Nhdr bits that may convey configuration parameters for a decoder. The header, exponent tokens, and mantissa fields of a compressed data packet may have varying bit widths. The concatenated bits of the compressed data packet may be stored in a memory Nb bits at a time, where Nb is the preferred memory width of a computing system. Example values of Nb are 32, 64, or 128 bits.

Figure 17:
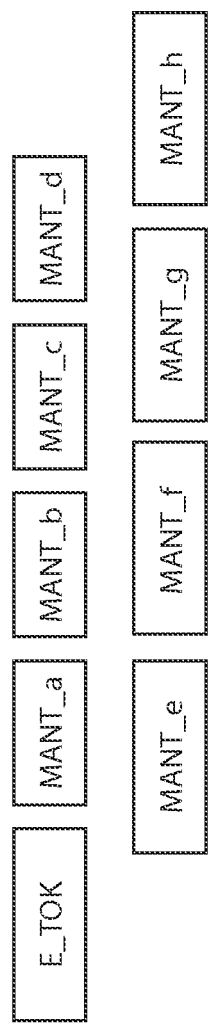
FIG. 17 illustrates another configuration of an exponent token and mantissa tokens for a compressed data packet.

FIG. 17 illustrates another configuration of an exponent token and mantissa tokens for a compressed data packet. In this configuration, the exponent token E_TOK represents two exponent differences of maximum exponents for successive encoding groups. The exponent token E_TOK corresponds to two block exponents e1 and e2. Block exponent e1 indicates the number of bits in each of the first four mantissa tokens MANT_a to MANT_d and exponent e2 indicates the number of bits in each of the second four mantissa tokens MANT_e to MANT_h. A compressed data packet may contain a combination of the configurations for exponent tokens and mantissa tokens shown in FIGS. 16 and 17, where an exponent token may be followed by four or eight mantissas. Selection of exponent tokens for one or two exponent differences is further described below with respect to FIGS. 19 and 26 and in the '803 patent.

FIGS. 3-17 have described the individual components of the compression and decompression functions using SIMD operations. The use of these components in embodiments of the compressor 52 (FIG. 1) and the decompressor 80 (FIG. 2) is described next.

Figure 18:
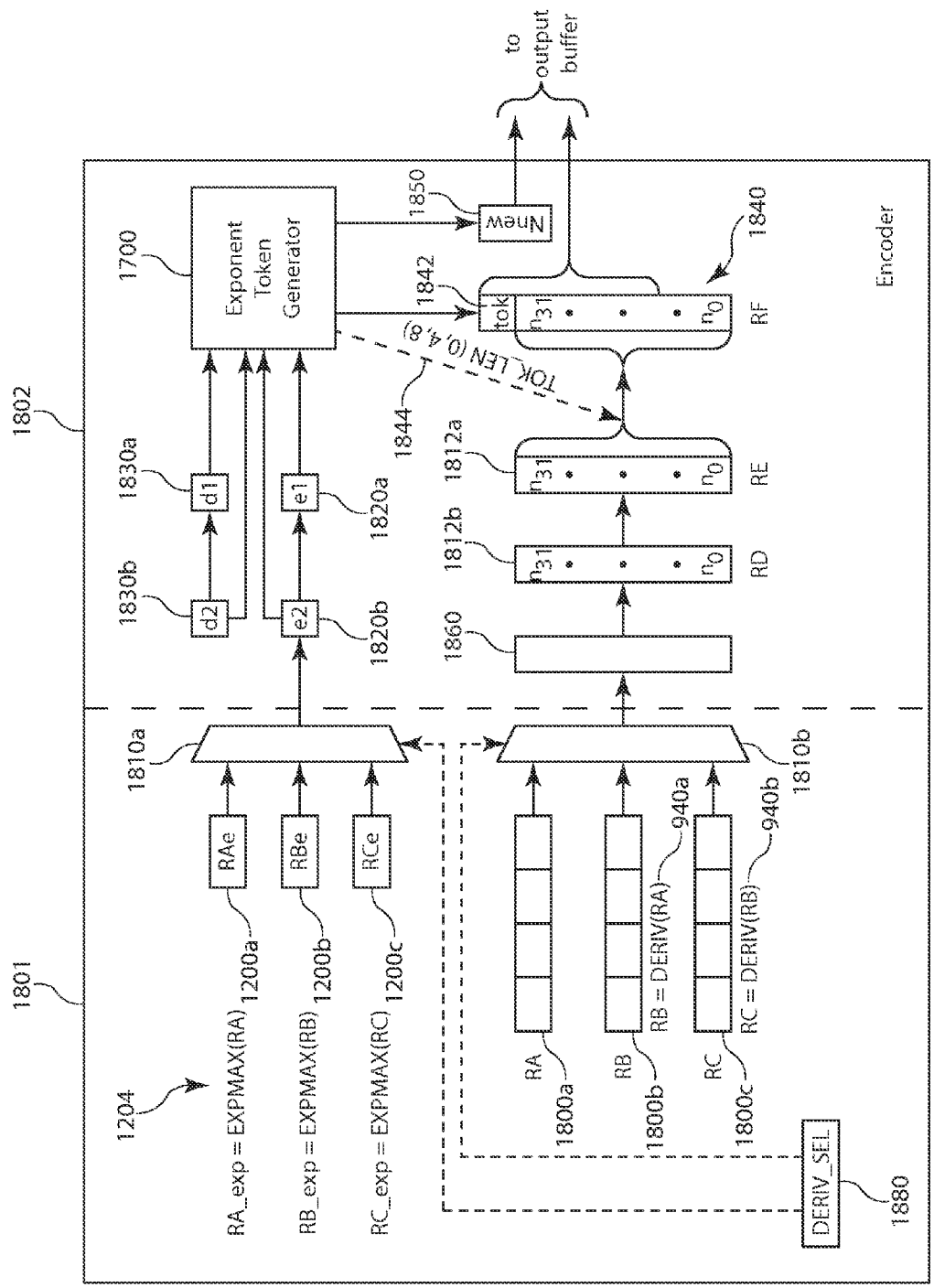
FIG. 18 illustrates a preferred embodiment of the compressor using SIMD registers and operations.

FIG. 18 illustrates an embodiment of the compressor 52 using SIMD registers and operations. The resources for this example of the redundancy remover 1801 include SIMD input registers 1800a, 1800b, and 1800c, exponent registers 1200a, 1200b, and 1200c, and derivative selection signal (DERIV_SEL) 1880 with associated SIMD register selector 1810b and exponent register selector 1810a. The resources for this example of the bit packer 1802 include the nibble interleaver 1860, exponent registers 1820a and 1820b, exponent difference registers 1830a and 1830b, intermediate SIMD registers 1810a and 1810b, exponent token generator 1700, output staging register 1840, and output size register 1850. The SIMD input register 1800a [RA] holds input samples that provide the numerical operands for the operations of the redundancy remover 1801. In alternative embodiments, a SIMD attenuation operation to multiply the samples of input register 1800a [RA] by an attenuation factor and store the result back in the register 1800a [RA] may be included, where the attenuation factor is stored in another register (not shown). The operations of redundancy remover 1801 and bit packer 1802 reduce the number of bits required to store the SIMD input register 1800a's numerical operands.

For example, SIMD input register 1800a [RA] may contain four 32-bit operands, whose operands may be four 32-bit integers or four 32-bit floating-point samples. SIMD register 1800b [RB] holds the results of SIMD instruction 940a, RB=DERIV(RA), the first derivative of the input samples from the SIMD input register 1800a. SIMD register 1800c [RC] stores the result of SIMD instruction 940b, RC=DERIV(RB), the second derivative of the input samples from the SIMD input register 1800a. Registers 1200a [RAe], 1200b [RBe], and 1200c [RCe] respectively hold the block exponents for SIMD registers 1800a [RA], 1800b [RB], and 1800c [RC]. Derivative selection signal 1880 [DERIV_SEL] controls the operation of SIMD register selector 1810b and exponent register selector 1810a. In one alternative, the derivative selection signal 1880 may be set in accordance with a parameter selected by a user. In another alternative, the redundancy remover 1801 may measure the samples and derivatives and set the derivative selection signal 1880 to select the registers providing the most compression. In a preferred embodiment, derivative selection signal 1880 is fixed for each group of samples to be stored in the same compressed data packet and derivative selection signal 1880 is indicated in the packet header 610, as further described with respect to FIG. 24.

The register selector 1810b provides access to the selected SIMD register RA, RB or RC for the nibble interleaver 1860. The register selector 1810b may be implemented by a mux with three inputs, from registers 1800a-c and one output provided to the nibble interleaver 1860. The widths of the mux inputs and output are preferably the same as the SIMD registers 1800a-c. For this example, the widths are 128 bits, but other widths are possible. The nibble interleaver 1860 reorders the bits of the operands of the selected register according to their place value, as described with respect to FIG. 13, and stores the interleaved bits in register 1812b (RD). For this example of four operands in each register 1800a-c, each nibble in the register 1812b (RD) has one bit from each operand of the selected register. Intermediate SIMD registers 1812a (RE) and 1812b (RD) store the nibble-interleaved output of nibble interleaver 1860 for sequential encoding groups.

The maximum exponent values for the registers 1800a-c are calculated in accordance to the EXPMAX instructions 1204 and stored in the corresponding exponent registers 1200a-c, as described with respect to FIG. 12. The selector 1810a selects the exponent register RAe, RBe or RCe in accordance with the derivative selection signal 1880. The selected exponent register RAe, RBe or RCe corresponds to the selected SIMD register RA, RB or RC. Sequential selected exponent values are stored in registers 1820b and 1820a. Register 1820a stores the exponent e1 from a previous iteration. Differences between the selected maximum exponent values for successive iterations are calculated and stored in the exponent difference registers 1830a and 1830b. Exponent difference register 1830a holds the difference d1 between the maximum exponent value e1 and the maximum exponent value that preceded e1 (e0), while exponent difference register 1830*b* holds the difference between maximum exponent value e2 and maximum exponent value e1. The exponent token generator 1700 (further described with respect to FIGS. 20 and 21) generates exponent token "tok" 1842 that requires token length TOK_LEN bits. In a preferred embodiment, the exponent token lengths may be 0, 4 or 8 bits. The SIMD registers 1810*a* (RE) and 1810*b* (RD) store the sequential nibble-interleaved outputs of nibble interleaver 1860 while exponent token generator 1700 generates exponent token 1842. Output staging register 1840 (RF) stores the exponent token 1842 and a version of intermediate register 1812*a* that has been shifted by token length TOK_LEN bits.

Figure 20:
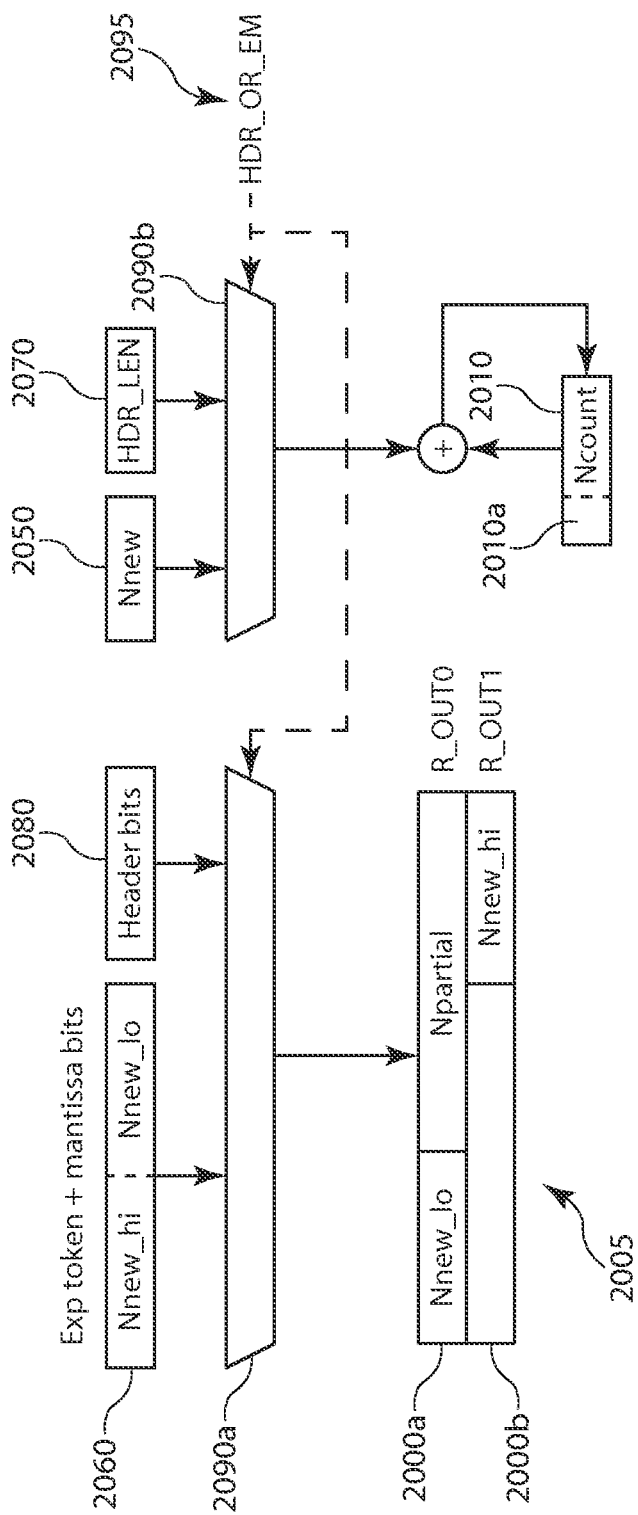
FIG. 20 illustrate operations of an encoded memory packer, the final stage of encoding.
Figure 21:
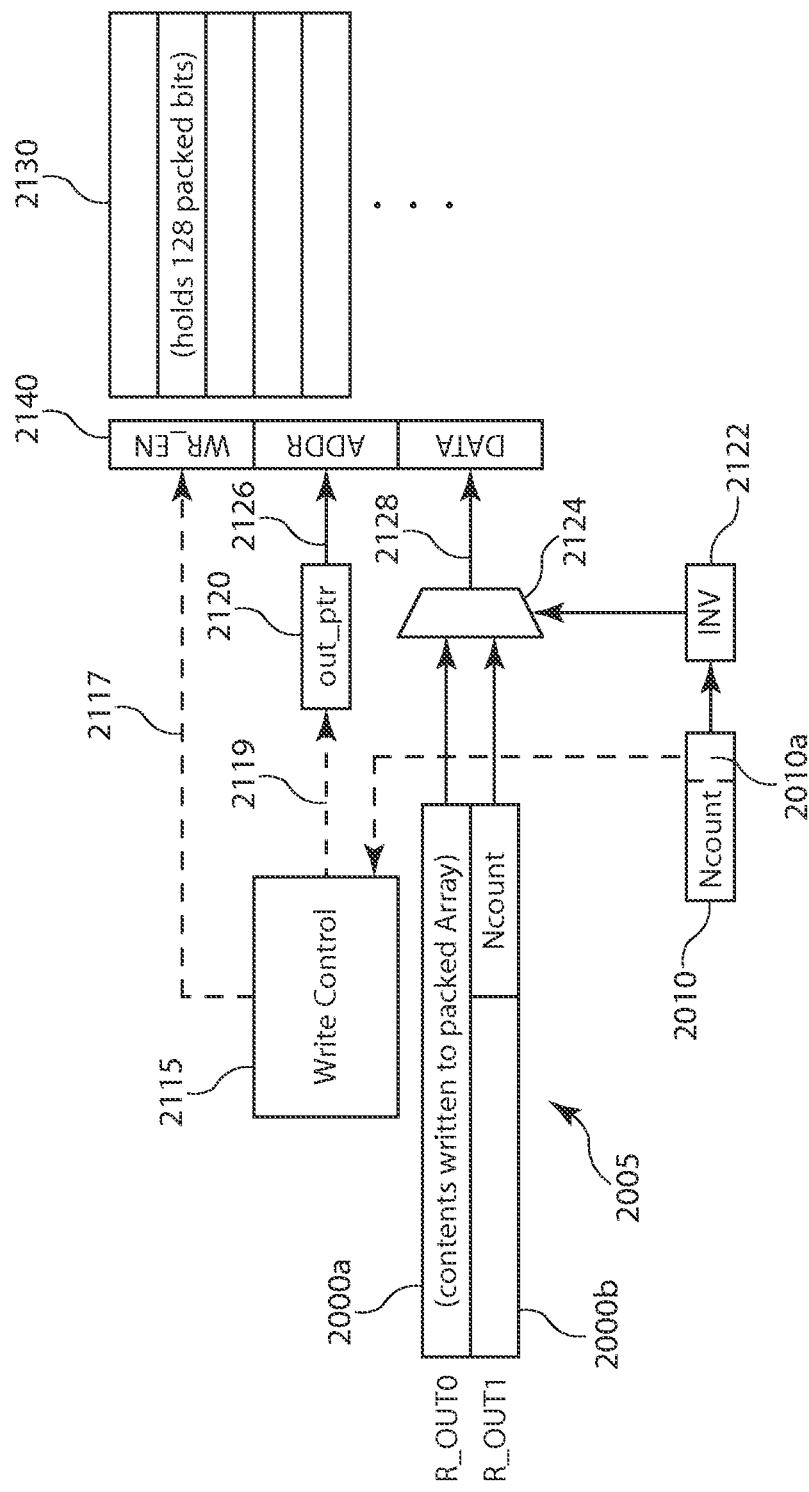
FIG. 21 illustrates operations for writing packed output words to a packed array.

Output size register 1850 stores the number of bits Nnew to be packed by the encoded memory packer 2005, which is further described with respect to FIGS. 20 and 21. If the data type of operands in the input register 1800*a* (RA) is 32-bit integer, a number of least significant nibbles from the output staging register 1840 (RF), as described with respect to FIG. 14, will be packed. If the data type of operands in input register 1800*a* are 32-bit floats, a number of most significant nibbles from the output staging register 1840 (RF), as described with respect to FIG. 15, will be packed. The number of bits to be packed, including exponent tokens and encoded mantissas for the encoding group, is indicated by the parameter Nnew.

The exponent token generator 1700 provides exponent tokens based on the exponent difference values or the maximum exponent values. FIG. 19 shows a preferred encoding table of the exponent token generator 1700 for the mapping between the exponent tokens and the exponent difference values or the maximum exponent values. The inputs to exponent token generator 1700 include maximum exponent 1820*a* (e1), maximum exponent 1820*b* (e2), exponent difference 1830*a* (d1), and exponent difference 1830*b* (d2). An exponent token can represent one maximum exponent (e1) or 2 maximum exponents (e1 and e2, represented indirectly by exponent differences d1 and d2). Exponent token generator 1700 generates exponent tokens that fall into three conditions:

Joint exponent condition—Exponent token 1842 represents 2 jointly encoded exponent differences, and the exponent token length 1844 is 4 bits, as shown in the rows 1870

Difference exponent condition—Exponent token 1842 represents one exponent difference, and the exponent token length 1844 is 4 bits, as shown in the rows 1872

Absolute exponent condition—Exponent token 1842 represents one exponent that is absolutely encoded, and the exponent token length 1844 is 8 bits, as indicated by the bottom row of the table, as shown in row 1874.

When exponent differences 1830*a* (d1) and 1830*b* (d2) are both in the range {−1 to +1}, the corresponding maximum exponents e1 and e2 can be represented using a 4-bit exponent token 1842, whose token length 1844 is 4 bits. When exponent differences 1830*a* (d1) and 1830*b* (d2) are not both in the range {−1 to +1}, but exponent difference d1 is in the range {−2 to +2}, the single exponents e1 can be represented using a 4-bit exponent token 1842, whose token length 1844 is 4 bits. When either d1 1830*a* or d2 1830*b* fall outside the range {−2 to +2}, the maximum exponent e1 is absolutely encoded using an 8-bit exponent token 1842, whose token length is 8 bits. In this final condition, the exponent token begins with the 3 bits '111' followed by the 5 bits 'abcde', which can represent absolute exponent lengths from 0 to 32. When the exponent for an encoding group is 0, no mantissa bits are sent for that encoding group. Exponent token generator 1700 also calculates the total number of exponent token bits plus mantissa bits to determine Nnew 1850, the number of bits to be packed for the encoding group. The number of bits for each encoded mantissa in the encoding group is given by the maximum exponent value. The number of mantissa bits in the encoding group is given by the number of mantissas in the encoding group multiplied by the number of bits per encoded mantissa. Exponent token generator 1700 may generate one or two exponent tokens 1842, token length (TOK_LEN) 1844 values, and Nnew 1850 values, depending on the d1 1830*a* and d2 1830*b* values. During joint exponent encoding, when only one token is generated for two maximum exponents, no exponent token is encoded for the second mantissa group, as indicated by the token lengths for the rows 1870. The resulting encoded groups correspond to the configuration shown in FIG. 17. For example, when {d1, d2}={0, 0}, exponent token 1842 is '0100', token length 1844 is 4 for the first mantissa group and 0 (no token) for the second mantissa group. Similarly, Nnew 1850 is e1+4 for the first mantissa group and e2 for the second mantissa group. The '803 patent, entitled "Block Floating-point Compression of Signal Data," describes other embodiments of the exponent token generator 1700.

The example of the redundancy remover 1801 depicted in FIG. 18 calculates first order and second order derivatives and the corresponding maximum exponent values for the registers 1800*a-c*. The selectors 1810*a,b* each select from three alternatives, in accordance with the with the derivative selection signal 1880. In other embodiments, the redundancy remover 1801 may include registers and instructions for additional higher order derivatives, wherein the selectors 1810*a,b* may select from more than three alternatives. In another embodiment, the redundancy remover 1801 may calculate the first order derivative, not the second order derivative, using two registers 1800*a,b* and two exponent registers 1200*a,b*, and the selectors 1810*a,b* would select from two alternatives. In another embodiment, the redundancy remover 1801 may use a fixed derivative order and would not include selectors 1810*a* and 1810*b*. In another embodiment, the redundancy remover 1801 may calculate the maximum exponent of the input samples in register 1800*a* for the exponent register 1200*a* and may not include derivative operations, the associated registers 1800*b,c* and 1200*b,c*, and the selectors 1810*a* and 1810*b*. For this alternative embodiment, the bit packer 1802, would encode and pack the block exponents and mantissas of the input samples in register 1800*a*.

FIGS. 20 and 21 illustrate operations of an encoded memory packer 2005, the final stage of compression that writes encoded bits of a fixed width Nout to packed array 2130. For example, Nout may be 32, 64, or 128 bits. For the example of FIG. 21, Nout=128. Packed array 2130 may be stored in any suitable on-chip or off-chip memory, including cache memory (typically on-chip, on the same die as the encoding logic) or double data rate random access (DDR) memory (typically on a separate, off-chip die from the encoding logic). In a preferred embodiment, output registers 2000*a* and 2000*b* have the same width as packed array 2130. In the example of FIG. 20, output registers 2000*a* and 2000*b* are each 128 bits wide (Nout=128), the same width as SIMD registers 1800*a-c*. Encoded memory packer 2005 can encode header bits 2080 having header length 2070 bits (HDR_LEN) or packed exponent token and mantissa bits 2080 having Nnew 2050 bits (Nnew), according to the value of exponent-mantissa selector 2095 (HDR_OR_EM). In a preferred embodiment, HDR_OR_EM selector 2095 encodes EM with value 0 (encode exponent+mantissa bits 2060) and HDR with value 1 (encode header bits 2080). Output registers 2000*a* and 2000b implement a double-buffering technique, where samples are written to the first ("active") register until the register contains more than Nout=128 bits, whereupon remaining bits are stored in the second ("overflow") register. Bit count register 2010 (Ncount) contains the count of all bits stored in both output registers 2000a and 2000b. When bit count register 2010 exceed Nout after packing new header or exponent-mantissa bits, the "active" output registers 2000a or 2000b will be written to the encoded output array 2130. FIG. 21 illustrates operations for writing of packed output words to the packed array 2130. When new bits are provided to encoded memory packer 2005, bit count register 2010 is incremented by Nnew 2050 or HDR_LEN 2070, depending on the value of HDR_OR_MEM 2095. Bit count register 2010 is typically one bit wider than the number of bits required to encode Nout. For example, when Nout=128 bits wide (requiring 7 address bits), bit count register 2010 would be 8 bits wide. The most significant bit (MSbit) 2010a of bit count register 2010 indicates whether output register 2000a or 2000b will be filled with exponent-mantissa bits 2060 or header bits 2080. When MSbit 2010a=0, output register 2000a is the "active" register; when MSbit 2010a=1, output register 2000b is the "active" register. Encoded memory packer 2005 aligns the Nnew 2050 or HDR_LEN 2070 bits with the Ncount bits 2010 currently stored in the "active" register (2000a or 2000b). Any overflow bits remaining after the "active" register has been packed are stored in the "overflow" register (2000b or 2000a).

After packing the new bits into output registers 2000a and/or 2000b, if the updated bit count register 2010a equals or exceeds Nout, all Nout bits of formerly "active" register will be written to encoded output array 2130. FIG. 21 illustrates the details of how the "active" register's Nout bits are written to encoded output array 2130, under the control of write control logic 2115. Memory arrays may use at least 3 registers to write to locations in the associated encoded output array 2130:

address register 2126
data register 2128
write enable signal 2117.

Write control logic 2115 maintains a packed array pointer 2120 that holds the address of the next location to be written in packed array 2130. After bit count register 2110 has been incremented by Nnew 2050 or HDR_LEN 2070, write control logic 2115 detects when the MSbit 2010a of bit counter 2010 has changed state (from 0 to 1, or from 1 to 0). When this occurs, the previous "active" register now contains Nout bits that will be written to packed array 2130. To perform this write, write control logic 2115 activates write enable signal 2117, which causes the contents of data register 2140 to be written to the address specified in address register 2126 (the address stored in packed array pointer 2120). If MSbit 2010a is set to "1", the Nout bits of output register 2000a will be written to data register 2128. If MSbit 2010a is set to "0", the Nout bits of output register 2000b will be written to data register 2128. Write mux 2124 is controlled by the inverted MSbit 2110a signal (inverted by inverter 2122). When the input to inverter 2122 is a 0, the output is a 1. When the input to inverter 2122 is a 1, the output is a 0. After the newly written data value in data register 2128 has been written to packed array 2130, write control logic 2115 enables the address increment signal 2119, which increments the output pointer. Packed array pointer 2120 may be incremented by 1 or other appropriate amount, depending on the addressing scheme used to access packed array 2130. The packed array 2130 may hold one or more compressed data packets, described with respect to FIGS. 16 and 17.

To summarize, FIGS. 18-21 have described embodiments of the compressor 52, or numerical encoder, which accepts integer or floating-point input samples in a SIMD input register and generates encoded compressed data arranged in compressed data packets and written to packed array 2130, using a sequence of SIMD instructions. FIGS. 22-30 will now describe the operations of the decompressor 80 (FIG. 2), or numerical decoder which accepts encoded compressed data from a compressed data packet and outputs decoded integer or floating-point samples in a SIMD output register. The decompression operations include operations for bit unpacking and signal regeneration. Operations for bit unpacking process the compressed data packets to produce unpacked mantissas and decoded exponents for the encoding groups. Operations for signal regeneration invert the operations of the redundancy removal applied for compression to produce decompressed samples. In the examples described in FIGS. 22-30, the SIMD registers are assumed to have a width of 128 bits and store four 32-bit integers or four 32-bit floating-point samples. In alternative implementations, the SIMD registers could hold more or fewer than 128 bits and the operands in the SIMD registers could be 8, 16, 32, 64, where operands typically are an integer divisor of the SIMD register width. Variations in SIMD registers and operands do not limit the scope of the present invention. The examples below are simply illustrative of one implementation of SIMD instructions for a decoder.

Figure 22:
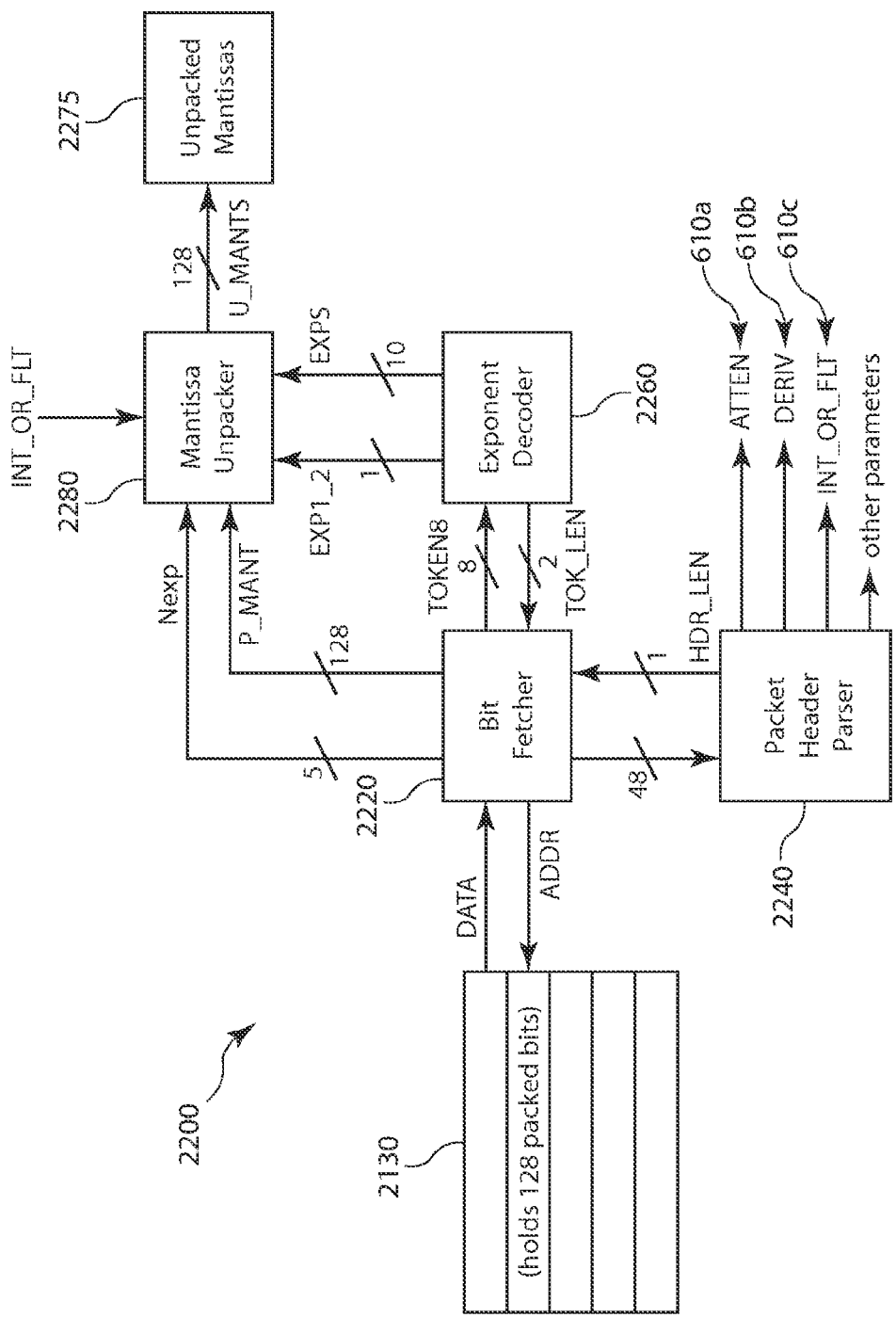
FIG. 22 illustrates operations a bit unpacker that uses a sequence of SIMD instructions to decode a packed array containing encoded (compressed) integer or floating-point samples.

FIG. 22 illustrates operations of a bit unpacker 2200 that uses a sequence of SIMD instructions to decode a packed array 2130 containing encoded (compressed) integer or floating-point samples. Bit unpacker 2200 comprises functional blocks for operations of three clients: bit fetcher 2220, packet header parser 2240, exponent decoder 2260, and mantissa unpacker 2280. Bit fetcher 2220 fetches packed units (typical having bit width of 32, 64, or 128 bits) from packed array 2130, using address ADDR that indexes into packed array 2130. In addition to the address pointer into packed array 2130, bit fetcher 2220 maintains a bit counter so that the current Nbits most recent bits are available to bit fetcher 2220's clients. The bit fetcher 2200 separates the packet header data from the compressed data of compressed data packet. For the packet header data, depending on its state, bit fetcher 2220 passes the 48 most recent bits to packet header parser 2240, which parses the 48 bits and determines whether 32 or 48 bits are required, according to control bits in each packet header 610. The packet header parser extracts parameters from the header data that are used for decoding operations, as described with respect to FIG. 24. The compressed data include exponent tokens and mantissa tokens, as described with respect to FIGS. 16 and 17. For the exponent tokens, depending on its state, bit fetcher 2220 passes the 8 most recent bits to exponent decoder 2260, which decodes each exponent token 1842 and determines whether 0, 4, or 8 bits make up the current exponent token. For the mantissa tokens, depending on its state, bit fetcher 2220 passes 4*Nexp most recent bits to mantissa unpacker 2280. For this example, 4*Nexp<=128. The mantissa unpacker 2280 unpacks the encoding groups of mantissa tokens. For reconstructing for integer samples, and the mantissa unpacker 2280 appropriately sign-extends the mantissa group's most significant bits. For reconstructing floating-point samples, the mantissa unpacker 2280 zero-fills the mantissa group's least significant bits. The mantissa unpacker 2280 reconstructs integer or floating-point samples under the control of INT_OR_FLOAT signal further described with respect to FIG. 23. The resulting decoded mantissas are stored in unpacked SIMD register 2275.

Figure 23:
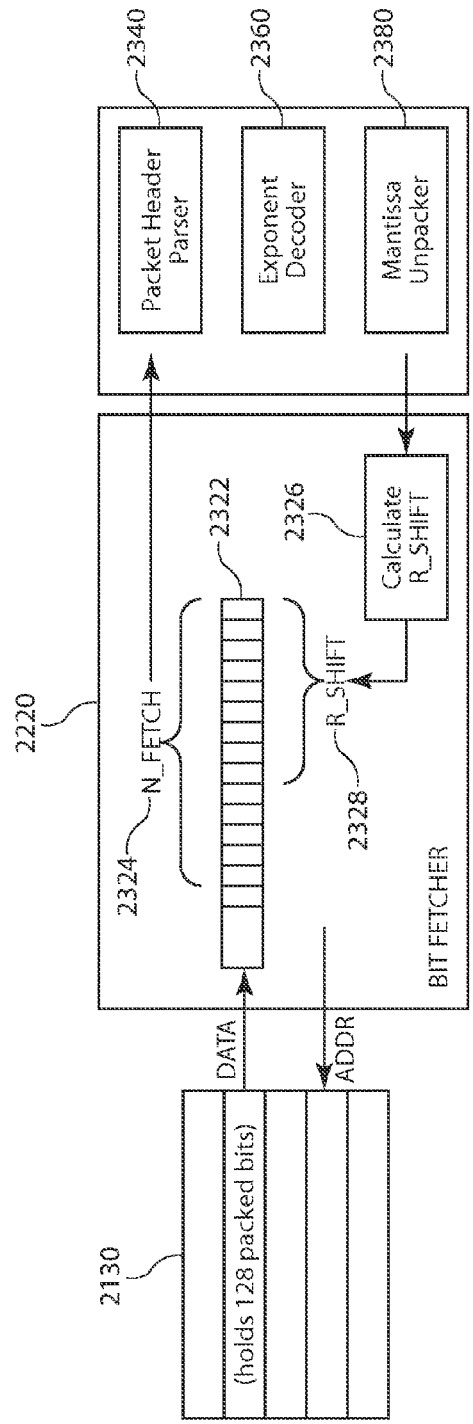
FIG. 23 illustrates operations of the bit fetcher, in accordance with a preferred embodiment.

FIG. 23 illustrates operations of the bit fetcher 2220, in accordance with a preferred embodiment. Clients of bit fetcher 2220 will request (or be provided with) up to 128 bits, not all of which will be required. The operations of bit fetcher 2220 performs three general functions for all of its clients:

It maintains at least 128 bits in decode bit register 2322,
It provides N_FETCH bits 2324 to its clients, and
It discards R_SHIFT bits 2328 by right-shifting the decode bit register 2322, and then optionally reading an additional 128 bits from packed array 2130 to maintain at least 128 bits in decode bit register 2322.

As shown in bit fetch state machine table 2326, bit fetcher 2220 has three states: a header parsing state, an exponent decoding state, and a mantissa unpacking state, which correspond to the three types of encoded units previously discussed with respect to FIGS. 16 and 17. In the header parsing state, bit fetcher 2220 provides 48 bits from decode bit register 2322 to packet header parser 2340. In a preferred embodiment of the packet header (further described in FIG. 24), a packet header contains either 32 or 48 bits. After parsing the packet header, packet header parser 2340 returns an R_SHIFT value of 32 or 48, or in a preferred embodiment, a HDR_LEN indicator of 0 or 1 to bit fetcher 2320. Bit fetcher 2320 then right-shifts the decode bit register 2322 by 32 bits (when HDR_LEN=0) or by 48 bits (when HDR_LEN=48). If after right-shifting the number of bits in decode bit register 2322 is less than 128, packet header parser 2340 reads an additional 128 bits from packed array 2130. Similarly, bit fetcher 2220 provides 8 bits to exponent decoder 2360, which returns a R_SHIFT count of 0, 4, or 8 bits (or in a preferred embodiment, a TOK_LEN indicator of 0, 1, or 2) to bit fetcher 2220. Bit fetcher 2220 then right-shifts the decode bit register 2322 by 0, 4, or 8 bits when TOK_LEN=0, 1, or 2, respectively. If after right-shifting the number of bits in decode bit register 2322 is less than 128, packet header parser 2340 reads an additional 128 bits from packed array 2130. Similarly, bit fetcher 2220 provides 128 bits to mantissa unpacker 2360, which returns a R_SHIFT count of 4*Nexp, where Nexp is the exponent bit width for the current mantissa group. Bit fetcher 2320 then right-shifts the decode bit register 2322 by 4*Nexp bits. If after right-shifting the number of bits in decode bit register 2322 is less than 128, packet header parser 2340 reads an additional 128 bits from packed array 2130.

FIG. 24 describes a configuration for a packet header 610. In a preferred embodiment, the packet header 610 contains 32 bits when the compressed data packet contains compressed integer samples or 48 bits when the compressed data packet contains compressed floating-point samples. Packet header 610 includes six fields 610a thru 610f Column 2451 lists example names for each packet header field, while Column 2452 provides additional comments about each field, including bit encoding for that field, in a preferred embodiment. A synchronization field 610a aids in the synchronization of data from the compressed data packet, so that each compressed data packet begins with the same SYNC value. An attenuation field 610b holds the parameter ATTEN used to properly amplify the recovered mantissas after signal regeneration described below. A derivative field 610c specifies how many stages of integration operations are required during signal regeneration, which corresponds to the order of the derivative operation selected by the selector 1810b of the redundancy remover 1801. A data type indicator field 610d indicates whether the encoded mantissas represent integers or floating-point samples. A reserved field 610e may be used to carry additional encoding parameters. An optional floating-point exponent scaling field 610f may be used for conversion of reconstructed integer samples to floating-point samples. Floating-point exponent scaling field 610f is present in packet header 610 if data type indicator field 610d indicates that the data type is floating-point.

Figure 25:
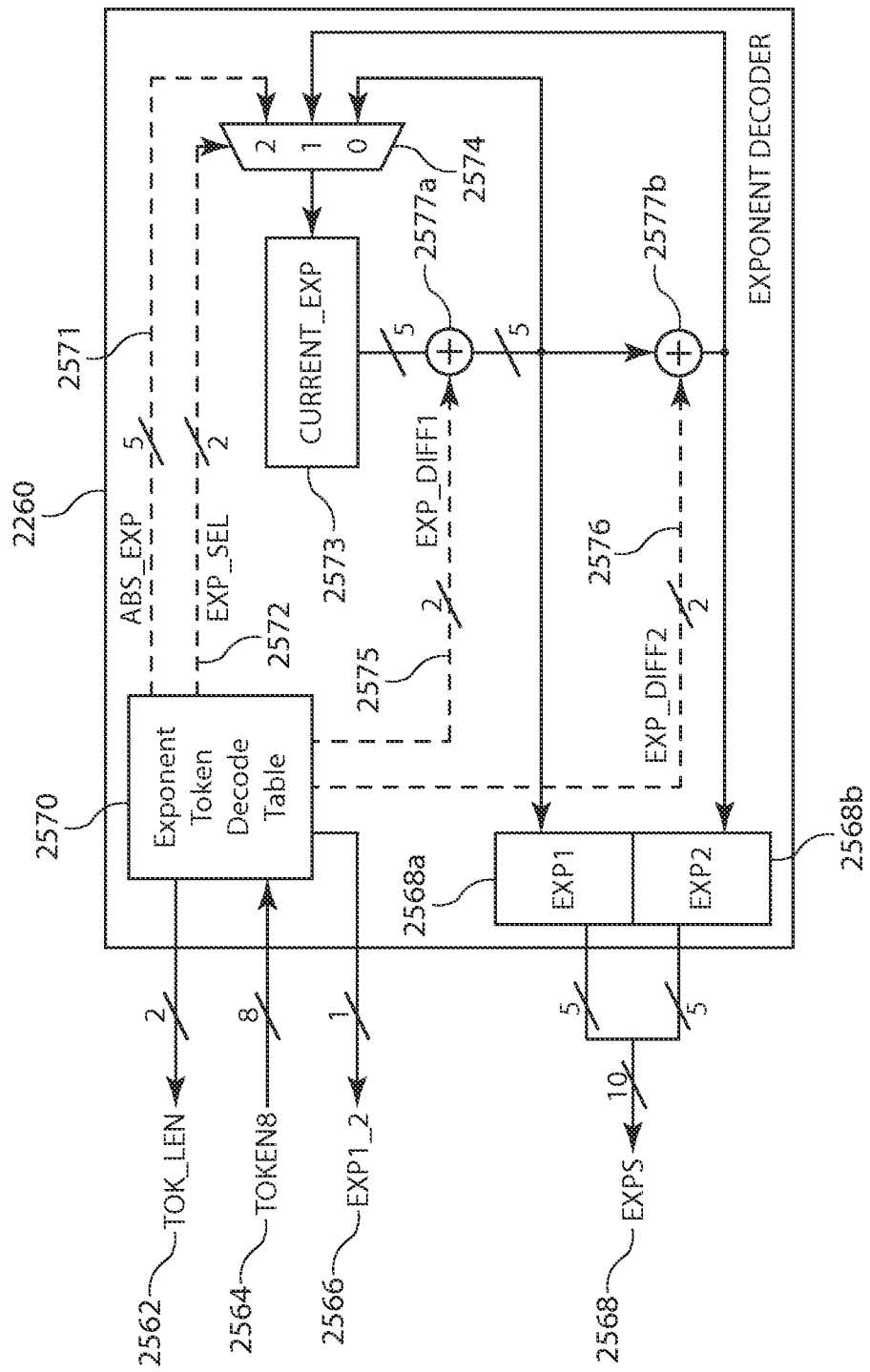
FIG. 25 illustrates a block diagram of exponent decoder.

FIG. 25 illustrates a block diagram of exponent decoder 2260. Bit fetcher 2220 provides exponent tokenTOKEN8 2564 to exponent token decode table 2570, which is further detailed in FIG. 26. In a preferred embodiment, exponent token 2564 contains 8 bits, to reflect the maximum exponent width of 8 bits used for absolute exponent encoding. Exponent decoding table 2570 generates token length TOK_LEN indicator 2562 and provides it back to bit fetcher 2220 to control R_SHIFT 2328. Exponent decoding table 2570 also generates exponent difference EXP_DIFF1 2575 and exponent difference EXP_DIFF2 2576. In a preferred embodiment, exponent decoder 2260 maintains an internal current exponent register 2573, which represent the most recently decoded exponent. The contents of current exponent register 2573 are added to exponent difference EXP_DIFF1 to generate exponent 1 2568a. Exponent1 2568a is added to exponent difference EXP_DIFF2 to generate exponent EXP2 2568b. As described with respect to FIG. 25, exponent EXP1 2568a and exponent EXP2 2568b are not both always valid, so exponent valid signal EXP1_2 2566 indicates whether one or both of exponent EXP1 2568a and exponent EXP2 2568b are valid. Under certain circumstances exponent token decoding table 2570 detects that an exponent has been absolutely encoded, requiring 8 exponent token bits. Under this circumstance, additional absolute exponent value ABS_EXP 2571 is also generated. Finally, exponent token decoding table 2570 generates an exponent selection control signal EXP_SEL 2572, which controls exponent selection mux 2574 that in turn controls the updated contents of current exponent register 2573. After an exponent decoding cycle, current exponent register 2573 may contain exponent EXP1 2568a, exponent EXP2 2568b, or absolute exponent value ABS_EXP 2571. The decoded exponent in the current exponent register represents the maximum exponent for the corresponding encoding group of mantissa tokens.

FIG. 26 shows an exponent token decoding table 2570 used for operations of the exponent decoder 2260. An "x" in a table entry indicates a "don't care" condition. In a preferred embodiment, token lengths of 0, 4, or 8 bits may be encoded as the 2-bit binary values 0, 1, or 2 for passing back to bit fetcher 2220. Since some exponent tokens represent two exponents (as previously described with respect to FIG. 18), exponent token decode table 2570 may provide 1 or 2 token length indicators TOK_LEN 2562 to bit fetcher 2220. The number of token length indicators generated for a given exponent token 2564 is indicated in column 2562 by the presence of 1 or 2 token length indicators. As a function of exponent token 2564, values for exponent difference EXP_DIFF1 2575 and exponent difference EXP_DIFF2 2576 are listed in FIG. 26. As a function of exponent token 2564, values for exponent valid signal EXP1_2 2566, absolute exponent value ABS_EXP 2571, and exponent selection control signal EXP_SEL 2572 are also listed in FIG. 26. In summary, exponent decoder 2260 generates either 1 or 2 exponents per exponent token 2564, providing exponent information sufficient to unpack 4 or 8 encoded mantissas, respectively.

Figure 27:
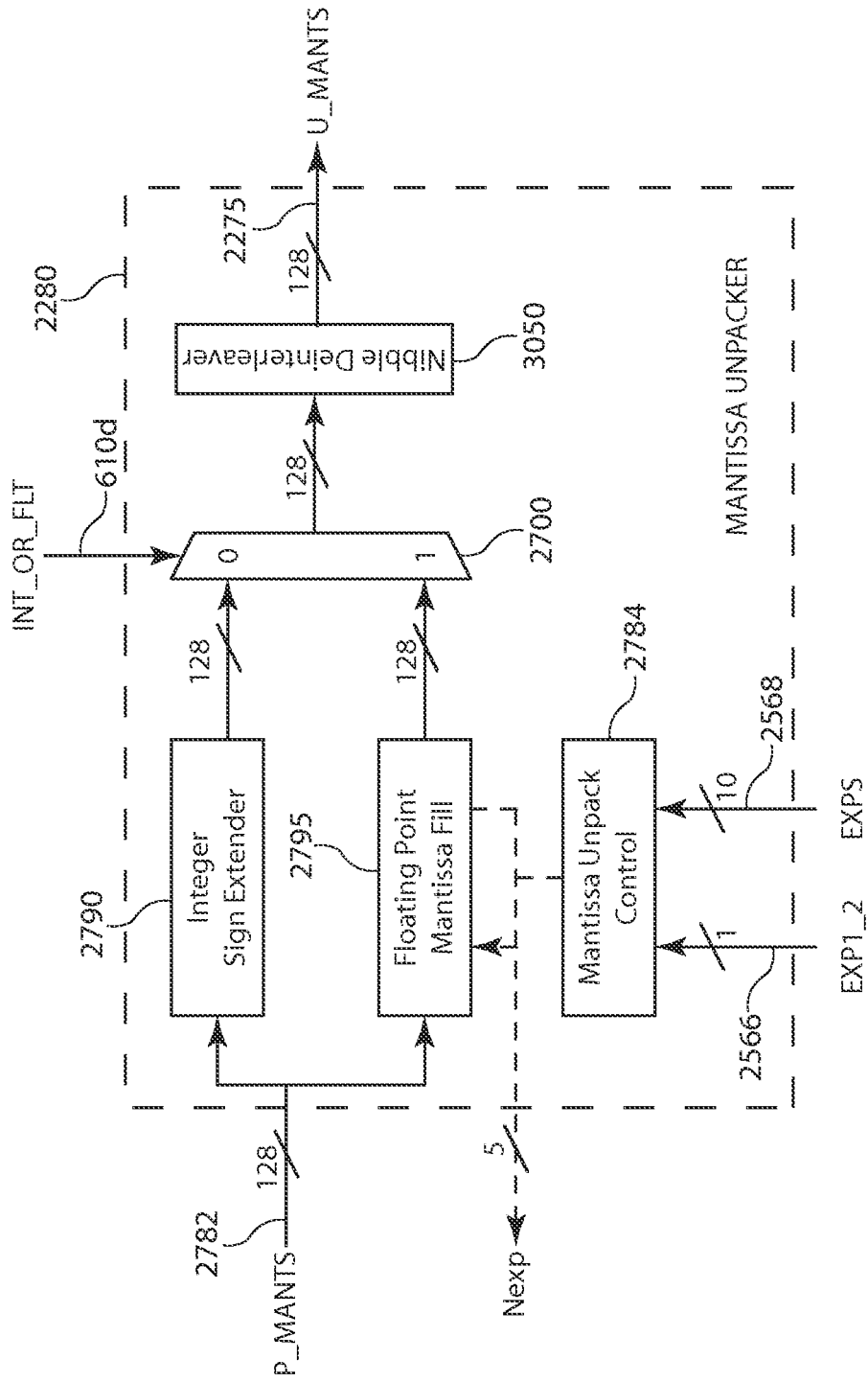
FIG. 27 illustrates the functions of mantissa unpacker.

FIG. 27 illustrates the functions of mantissa unpacker 2280. Exponent decoder 2260 provides mantissa unpacker 2280 with exponent valid signal EXP1_2 2566 and one or two exponents in the combined exponent register EXPS 2568. Mantissa unpack control block 2784 stores the 1 or 2 exponents internally, and makes 1 or 2 requests for 128 bits from bit fetcher 2220. By requesting the most recent 128 bits from bit fetcher 2220, mantissa unpacker 2280 can decode four packed mantissas into unpacked mantissa register U_MANTS 2275, since the maximum exponent value is 32. When exponent valid signal EXP1_2 2566 indicates that one exponent in combined exponent register EXPS 2568 is valid, mantissa unpack control 2784 enables decoding of four packed mantissas from packed mantissa bits P_MANT 2782 received from the bit fetcher 2220. When exponent valid signal EXP1_2 2566 indicates that two exponents in combined exponent register EXPS 2568 are valid, the mantissa unpack control 2784 enables decoding of two groups of four packed mantissas in sequence. The mantissa mux 2700 selects the input for the nibble deinterleaver 3050 from integer sign extender 2790 or from floating-point mantissa filler 2795 in accordance with the data type indicator INT_OR_FLT 610$d$ previously decoded from packet header 610 by packet header parser 2240.

As previously described with respect to FIGS. 14 and 15, the least significant nibbles of 32-bit integers or the most-significant nibbles of 32-bit floating-point samples, are stored in packed mantissas P_MANTS 2782. The integer sign extender 2790 and floating-point mantissa filler 2795 align the nibbles in packed mantissas 2782 for integer and floating-point samples, respectively, as described with respect to FIGS. 28 and 29. The mantissa mux 2700 selects the appropriate nibble alignment using the data type indicator 610$d$. The nibble deinterleaver 3050 completes the mantissa unpacking operation and generates the contents U_MANTS of unpacked SIMD register 2275, as described with respect to FIG. 30.

Figure 28:
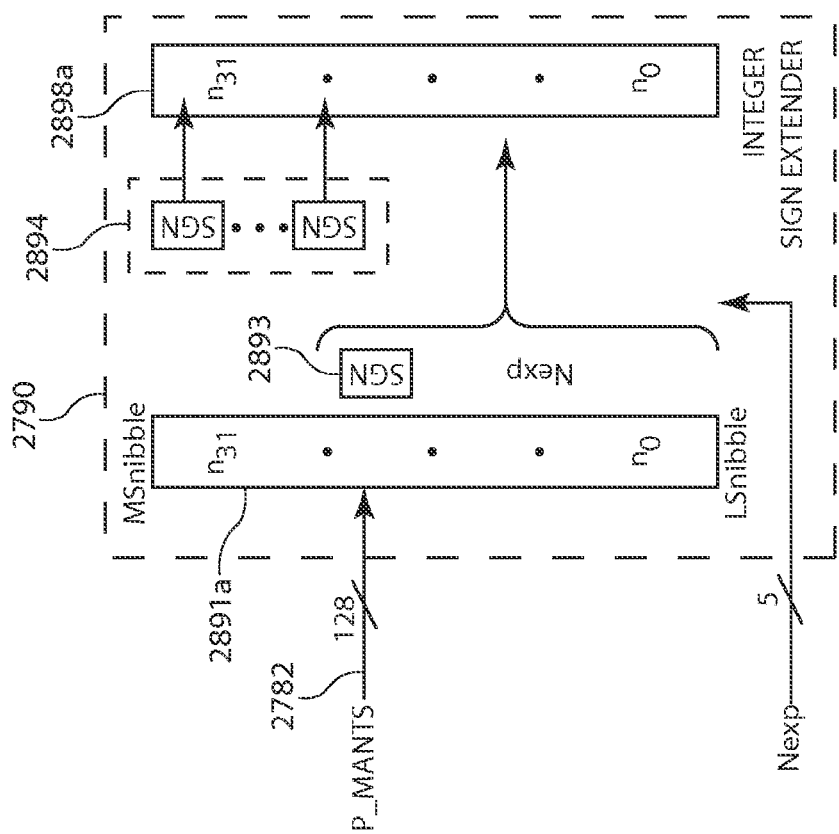
FIG. 28 illustrates the operations of integer sign extender.

FIG. 28 illustrates the operations of integer sign extender 2790. Given 128 candidate packed mantissa bits 2782 (P_MANTS) and block exponent (Nexp), integer sign extender 2790 copies Nexp nibbles from packed input register 2891$a$ into the lowest (right-most) Nexp nibbles in SIMD staging register 2898$a$. Additionally, the highest nibble 2893 containing the four sign bits SGN 2894 of the packed mantissas is replicated and copied into the upper nibbles of staging register 2898$a$. After this operation, the most significant nibbles of staging register 2898$a$ all contain sign extension nibbles. Staging register 2898$a$ is then ready for nibble deinterleaving, if selected by mantissa mux 2700.

Figure 29:
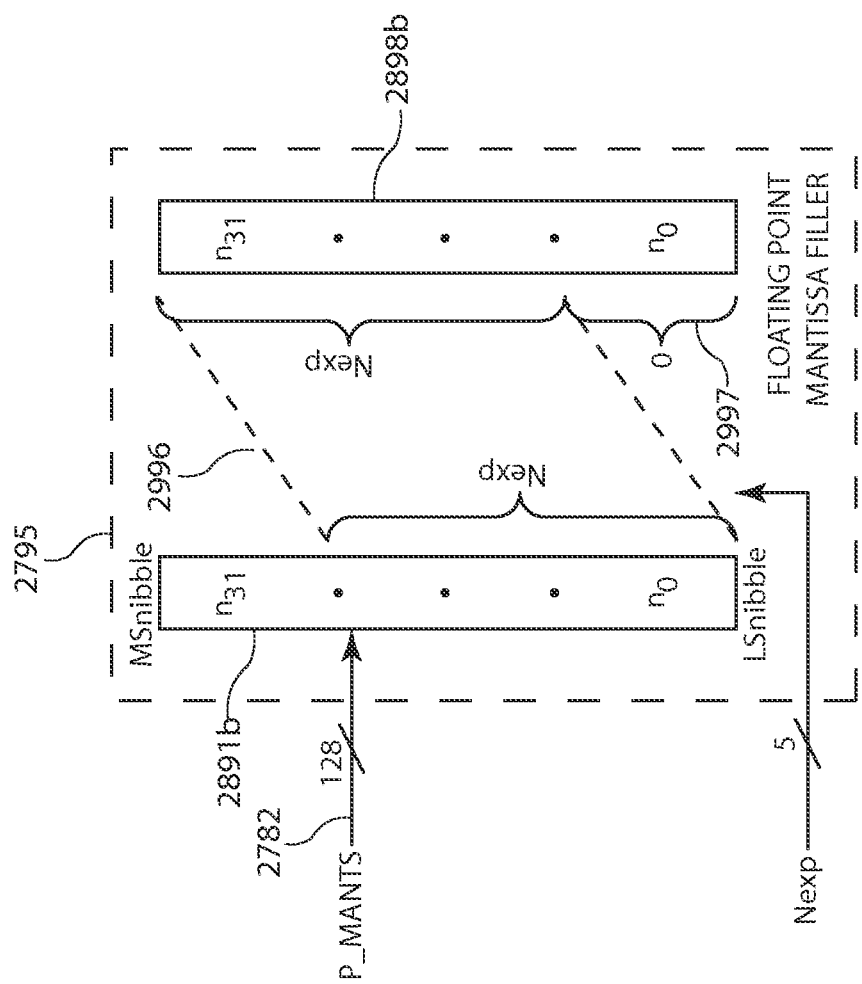
FIG. 29 illustrates the operations of floating-point mantissa filler.

FIG. 29 illustrates the operations of floating-point mantissa filler 2795. Given 128 candidate packed mantissa bits 2782 and exponent (Nexp), floating-point nibble aligner 2996 copies Nexp nibbles from packed input register 2891$b$ into the highest (left-most) Nexp nibbles in SIMD staging register 2898$b$. Additionally, the lower nibbles 2997 of staging register 2898$b$ are zero-filled. After this operation, the most significant Nexp nibbles of staging register 2898 contain the appropriate floating-point nibbles and the lower mantissa nibbles 2997 contain zeros. Staging register 2898$b$ is then ready for nibble deinterleaving, if selected by mantissa mux 2700.

Figure 30:
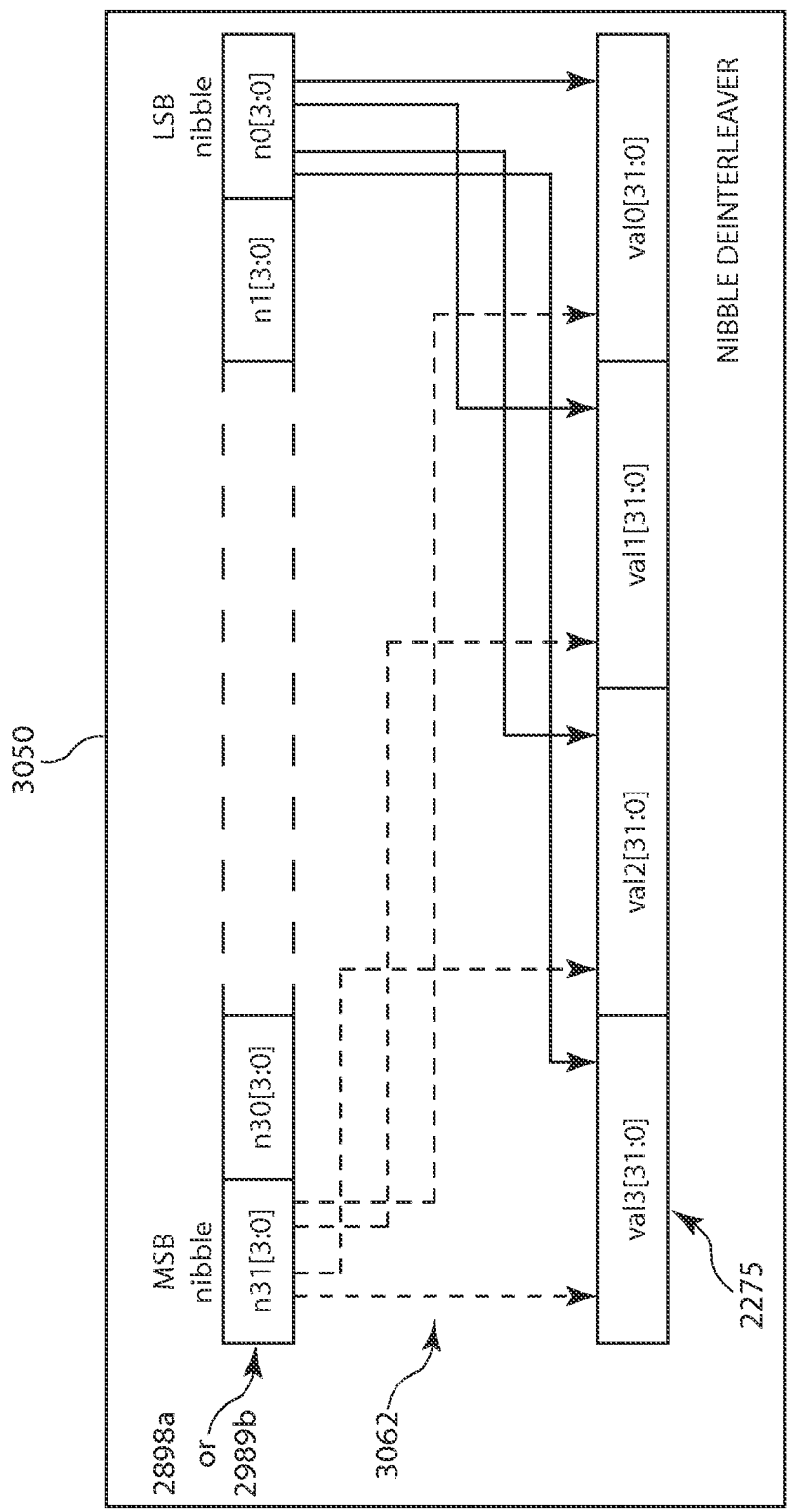
FIG. 30 illustrates operations of a nibble deinterleaver.

FIG. 30 illustrates operations of a nibble deinterleaver 3050. Nibble deinterleaver 3050 can unpack nibble-interleaved bits that were generated by nibble interleaver 1320, described with respect to FIG. 13, and nibble interleaver 1860 of FIG. 18. The input to nibble deinterleaver 3050 arrives in nibble-interleaved SIMD staging register 2898$a$ for integer format or 2898$b$ for floating-point format. After processing by nibble deinterleaver network 3062, the deinterleaved bits are stored in SIMD register 2275. The nibble deinterleaver network 3062 restores the original bit order to reconstruct samples to the data format of the samples prior to interleaving. In this example, 32-bit integer or floating-point samples, indicated by val0, val1, val2 and val3. The nibble deinterleaver 3050 in the context of the mantissa unpacker 2280 restores the mantissas' original order of bits for the subsets of bits that were packed. The mantissa unpacker 2280 restores the mantissas to the original length of the samples by zero-filling for floating-point samples or restoring sign extension bits for twos complement integer samples. These operations of the mantissa unpacker 2280 convert the packed mantissas to unpacked samples having an integer or floating-point format. The unpacked mantissas U_MANTS in register 2275 represent unpacked samples for further processing by signal regeneration operations.

Signal regeneration operations may be applied to the unpacked samples the SIMD register 2275 to reverse the operations performed by the redundancy remover 1801. The signal regeneration operations may include SIMD integration instructions 540, as previously described with respect to FIG. 5. The integration operation is performed in accordance with the parameter DERIV from the derivative field 610$c$, which was previously decoded by packet header parser 2240. The DERIV parameter determines the integral order for the integration operations that will invert the derivatives calculated redundancy remover 1801. When an attenuation operation was applied to the samples during compression, the decompression operations include multiplication by an amplification factor that approximately inverts the attenuation factor. The amplification factor is determined in accordance with the ATTEN parameter, from the attenuation field 610$d$ of the packet header 610.

FIGS. 31 and 32 give examples of pseudo-code instructions for encoding (compression) operations and decoding (decompression) operations. The pseudo-code is not intended to compile correctly or account for all possible conditions that would be required in an implementation of syntax-correct, fully-functioning software. The examples of pseudo-code instructions in FIGS. 31 and 32 simply illustrate sequences of the SIMD instructions for implementing compression and decompression operations. Many of the pseudo-code instruction operators have the prefix "V_", which is typical for SIMD operator names.

FIG. 31 provides an example of pseudo-code SIMD instructions for a program that encodes 4N integer or floating-point samples. The "N" in 4N indicates the number of iterations of the encoder function 700, where 4 samples are processed at each iteration a total of 4N samples. The encoder function 700 specifies an input array whose numerical operands are to be encoded, with input array pointer 701$a$ specifying the address of the first numerical operand to be encoded. For the example in FIG. 31, SIMD instructions that access memory will read or write four 32-bit samples (total of 128 bits) from or to memory, such as on-chip cache memory. Output array pointer 701$b$ specifies the start address where the encoded output values will be stored, i.e. the starting address of packed array 2130 (previously described with respect to FIG. 21). Loop counter 701$c$ specifies the number of samples to be encoded, divided by 4 (since each SIMD memory read instruction 815 fetches four 32-bit operands). Attenuator setting 701$d$ specifies the attenuation value for the 4N samples to be encoded. Typically the attenuator setting falls in the range from 0.0 and 1.0. The parameter "deriv" corresponds to the derivative selector DERIV_SEL 1880 (previously discussed with respect to FIG. 18) and specifies which derivative will be packed for the current encoding group.

The encoder function 700 is performed in three general phases:
Initialization (elements 705, 800, 710, and 805)
Encoding loop (elements 810, 815, 820, 940$a$, 940$b$, 817, 720, and 725)
Clean-up (elements 730, 735, 825, 830, and 740).

The initialization phase begins when start pointer address instruction 805 saves the output array pointer 701b in a local variable called "startPtr." The pack header instruction 705 [V_PACK_HDR] writes attenuator setting 701d and derivative selector 1880 to encoded packet header 610. In other embodiments, pack header instruction 705 may include additional header parameters, such as those described with respect to FIG. 23. Attenuator initialization instruction 800 loads attenuator setting 610d into all four 32-bit operands of SIMD register R4, which will be used in the encoding loop to attenuate the input samples by the same amount. Derivative specifier instruction 710 loads derivative selection parameter "deriv", or DERIV_SEL 1880, into a register that controls exponent register selector 1810a and SIMD register selector 1810b, previously described with respect to FIG. 18.

The encoding loop of FIG. 31 begins with loop initialization and control instruction 810, which specifies the start and end values of loop counter variable "i", and the incrementing of "i" with every loop iteration. SIMD register load instruction 815 [V_LOAD] loads four 32-bit operands from the current input array pointer 701a into SIMD register R1. The input array pointer is incremented after the four-operand fetch, effectively advancing the input array pointer 701a to the next four-operand memory location. The SIMD multiplication instruction 820 multiplies each of the operands in SIMD register R1 by the attenuator setting 701d (previously stored in SIMD register R4). Two sequential SIMD derivative instructions 940a and 940b generate the first and second derivatives of the four input operands, as previously described with respect to FIGS. 6, 7, 8, and 9. The first derivative is stored in SIMD register R2, while the second derivative is stored in SIMD register R3. Maximum exponent calculation and selection instruction 817 [V_EXPMAX] combines the operations of the EXPMAX 1204 instruction, the DERIV_SEL parameter 1880, and the selectors 1810a and 1810b previously described with respect to FIGS. 12 and 18. In one alternative, the operations of the V_EXPMAX instruction 817 may calculate the maximum exponent of the samples in a selected SIMD registers R1, R2, or R3, as determined by derivative selection parameter "deriv" (i.e. DERIV_SEL 1880). In another alternative, the operations of the V_EXP-MAX instruction 817 calculate the maximum exponents for the samples in the SIMD registers R1, R2 and R3 and select from the maximum exponents (i.e. from registers 1200a-c in FIG. 18), in accordance with derivative selection parameter "deriv" (i.e. DERIV_SEL 1880). The operations of V_EXP-MAX instruction 817 store the maximum exponent in register Re (i.e. register e2 1820b) and store the corresponding selected mantissas from R1, R2 or R3 in SIMD register R5. The packing instruction V_PACK_REG 720 combines the operations of the nibble interleaver 1860 and exponent token generator 1700, as described with respect to FIGS. 18 and 19. The operations generate the appropriate exponent token 1842 with the four packed mantissas 1840 from the selected SIMD register (R1, R2, or R3), using the maximum exponent information in SIMD register Re. The SIMD conditional write instruction V_WRITE_IF_FULL 725 implements the operations of the encoded memory packer 2005, described with respect to FIGS. 20 and 21. These operations combine the exponent token 1842 and four packed mantissas 1840 with any previously stored bits in output register 2000a,b and write any full 128-bit words of output register 2000a,b to packed array 2130.

The update phase of FIG. 31 begins with the SIMD flush instruction 730 [V_FLUSH], which causes any remaining bits in output register 2000a,b to be written to packed array 2130. Derivative update instruction 735 [V_UPDATE_D-ERIV] examines the three exponent registers 1200a-c (previously described with respect to FIG. 18) and updates derivative selection parameter "deriv" 1880 corresponding to the lowest count, i.e. the input samples, first derivative, or second derivative for the current encoding group that required the fewest mantissa bits. The updated derivative selection parameter "deriv", or DERIV_SEL 1880, will be used to select the SIMD register R1, R2 or R3 and the corresponding maximum exponent for the next encoding group processed in the next iteration. Packet length calculation instruction 825 calculates the difference between the final output pointer value (outPtr) and the initial output pointer (startPtr), which represents the number of 128-bit words written to packed array 2130 for the compressed data packet. Packet length error calculation instruction 830 calculates the difference between the current compressed packet's size (pktLen) and the target packet length during fixed-rate encoding. The SIMD attenuator update instruction 740 [V_UPDATE_ATTEN] updates attenuator setting 701d based on the packet difference previously calculated by packet length error calculation instruction 830. The V_UPDATE_ATTEN instruction 740 is further described with respect to FIG. 35. Encoder function 700 completes when function return instruction 840 is executed.

FIG. 31 describes two alternative ways that the encoding loop's instructions could be specified by combining two or more encoding loop instructions into a single instruction. Such combination of instructions may be allowed in SIMD architectures by combining the combinatorial logic and registers of the two instructions into back-to-back circuits, where the output of the first SIMD instruction becomes the input to the second (or subsequent) SIMD instruction. Such a combination may introduce additional latency but shortens program memory. In alternative 1a, the SIMD redundancy removal instruction 745 [V_RR] represents the sequential execution of the four SIMD instructions V_MPY 820, V_DERIV 940a (first call), V_DERIV 940b (second call), and V_EXPMAX 817. The SIMD pack and write instruction 750 [V_PACK_WRITE] represents the sequential execution of the two SIMD instructions V_PACK_REG 720 and V_WRITE_IF_FULL 725. In alternative 1b, the SIMD encode instruction 755 [V_ENCODE] represents the sequential execution of the SIMD instructions V_RR 745 and V_PACK_WRITE 750. In alternative 2, the SIMD encoder parameter update instruction 760 [V_UPDATE_PARAMS] represents the sequential execution of the SIMD instructions V_UPDATE_DERIV 735 and V_UPDATE_ATTEN 740.

FIG. 32 provides an example of pseudo-code SIMD instructions for a program that decodes compressed data packets to reconstruct 4N integer or floating-point samples. A decoder function 900 specifies an packed array 2130 to be decoded with input array pointer 901a specifying the address of the first compressed data packet in a sequence of one or more compressed data packets. In this example, SIMD instructions that access memory will read or write four 32-bit samples (total of 128 bits) from or to memory, typically on-chip cache memory. For other implementations, memory widths wider or narrower than 128 bits are possible. Output array pointer 901b specifies the start address where the decoded 128-bit output samples will be stored. Loop counter 901c specifies the number of samples to be decoded, divided by 4 (since each 128-bit memory write instruction 815 stores four 32-bit operands). Each iteration of the decoding loop in this example creates four new 32-bit operands.

The decoder function 900 is performed in three general phases:
  Initialization (elements 905, 910, and 800)
  Decoding loop (elements 812, 915, 920, 925a-b, 930a-b, 820a-b, 850a-b, and 860a-b)
  Update (elements 730 and 840).

The initialization phase begins when SIMD decode initialization instruction V_INIT_DECODE 905 initializes all decoder state machines and pointers.

Instruction V_INIT_DECODE 905 copies the input pointer 901*a* to an internal decoder register that points to the first 128 bits of packed array 2130. This instruction also increments input pointer 901*a* after reading the first 128 bits of packed array 2130 into decode bit register 2322, as previously described with respect to FIG. 23. Referring to FIG. 22, bit fetcher 2220 also maintains an internal counter of the available number of bits in decode bit register 2322, and reads in additional 128-bit groups from packed array 2130 as required, as packet header parser 2240, exponent decoder 2260, and mantissa unpacker 2280 specify how many bits R_SHIFT 2328 are discarded from decode bit register 2322. Whenever additional 128-bit groups are read from packed array 2130, the bit fetcher 2220 references (and then advances) the current input pointer. SIMD header fetch and decode instruction V_DECODE_HDR 910 fetches and decodes attenuator setting "atten" 610*b* and derivative selection parameter "deriv" 610*c* from packet header 610. In other embodiments, instruction V_DECODE_HDR 910 may return additional header parameters, such as those described with respect to FIG. 24. SIMD attenuator initialization instruction V_LOAD 800 loads the reciprocal of attenuator setting "atten" into all four 32-bit operands of SIMD register R4. Register R4 will be used in the encoding loop to amplify the samples at the end of signal regeneration processing.

The decoding loop of FIG. 32 begins with the "while" loop initialization and control instruction 812, which specifies that the code within the braces "{ }" will be repeated until the counter value N is zero or negative. The SIMD fetch exponent instruction V_FETCH_EXP 915 causes 8 bits from decode bit register 2322 in bit fetcher 2220 (FIGS. 22-23) to be transferred to exponent decoder 2260 (FIG. 25). Next, the exponent decode instruction V_DECODE_EXP instruction 920 performs the exponent decode functions previously described with respect to FIGS. 25 and 26 on these 8 bits. The decoded exponents resulting from the V_DECODE_EXP instruction 920 are stored in register R3, and the number of exponents is saved in the local variable nExps 921. Next, SIMD mantissa decode instruction V_DECODE_MANTS 925*a* causes 128 bits to be transferred from decode bit register 2322 in bit fetcher 2220 to mantissa unpacker 2280, which decodes and sign-extends the most significant SIMD register bits (for packed integers) or decodes and zero-fills the least significant SIMD register bits (for packed floats), as previously described with respect to FIGS. 27, 28, and 29. The result of mantissa unpacking is stored in register R2. The V_DECODE_MANTS instruction 925*a* includes a control parameter "1", which specifies that the first exponent in register R3 will be used to decode these four mantissas, since it is possible that the exponent token decoded by V_DECODE_EXP instruction 920 represented two exponents. Next, the V_INTEG_N macro 930 (further described in FIG. 33), invoked by instruction 930*a*, may calculate first or second order integration the contents of register R2 or no integration under the control of the derivative selection parameter "deriv" 610*c* (FIG. 24). The SIMD multiplication instruction V_MPY 820*a* multiplies each operand in SIMD register R1 by an amplification factor that is the reciprocal of the attenuator setting 610*b* that was stored in SIMD register R4 by V_LOAD instruction 800. The SIMD register write instruction V_STORE 850*a* writes the contents of the SIMD register R1 (four 32-bit words) to the decoded output array. The V_STORE instruction 850 increments output pointer 901*b* to reflect that 128 output bits were written to the output array. Finally, instruction 860*a* decrements group counter 901*c* ("while" loop 812 iteration counter).

Conditional test "if" instruction 924 determines whether an additional four mantissas should be decoded, which occurs when the value of local variable nExps 921 equals 2. In that case, the sequence of instructions {925*b*, 930*b*, 820*b*, 850*b*, and 860*b*} generates the second group of decoded 32-bit operands and writes them to the output array.

The update phase of FIG. 32 begins with the SIMD flush instruction 730 [V_FLUSH], which advances encoded input array pointer 901*a* if any partial bits remain in packed array 2130. Decode function 900 completes by executing function return instruction 840.

FIG. 32 describes two alternative ways that the decoding loop's instructions could be specified by combining two or more encoding loop instructions into a single instruction. Such combination of instructions may be allowed in SIMD architectures by combining the combinatorial logic and registers of the two instructions into back-to-back circuits, where the output of the first SIMD instruction becomes the input to the second (or subsequent) SIMD instruction. Such a combination may introduce additional latency but shortens program memory. In alternative 1, SIMD fetch and decode exponent V_FD_EXP instruction 935 represents the sequential execution of two SIMD instructions:

V_FETCH_EXP instruction 915, and
V_DECODE_EXP instruction 920,

Similarly, SIMD regenerate mantissas instruction 940 [V_REGEN] represents the sequential execution of four SIMD instructions:

V_UNPACK_MANTS instruction 925,
V_INTEG_N macro instruction 930,
V_MPY instruction 820, and
V_STORE instruction 850.

In alternative 2, the SIMD decode instruction V_DECODE 945 represents the sequential execution of the SIMD V_FD_EXP instruction 935 and SIMD V_REGEN instruction 750.

FIG. 33 further describes the V_INTEG_N macro 930, with input parameters SIMD input register Ra 930*a*, derivative selection parameter "deriv" 930*c*, and SIMD output register Rb 930*c*. Depending upon the value of derivative selection parameter "deriv" 930*c*, SIMD integration instruction 141 is called not at all (when deriv=0), once at instruction 141*a* (when deriv=1), or twice at instructions 141*b* and 141*c* (when deriv=2). In all 3 cases, the desired integration result is returned in output register Rb 930*b*. If the value of derivative control 930*c* is other than 0, 1, or 2, an error code is returned in output register Rb 930*b*.

Conditional execution of "if" statements generally slows down software execution, especially if the conditional test is performed in a loop such as "while" loop 812. For this reason, an alternative embodiment of FIG. 33's decode loop would include three separate "while" loops, each "while" loop containing the appropriate number of calls (0, 1, or 2) to V_INTEG instruction 141 for the derivative selection parameter "deriv" 610*c* value. Doing the derivative test once, prior to the main decode loop, speeds up the loop by moving the cost of executing conditional test "if" instruction 924 outside of the main loop. This alternative embodiment also does not require the V_INTEG_N macro 930.

FIG. 34 illustrates additional instructions for the encode function 700 to implement lossless, fixed rate, or fixed quality encoding operation modes. Depending on the nature and statistics of the numerical data being encoded, users may want to lossless encoding of the numerical data, so that the decoded numerical samples are identical to the original numerical samples. In other situations, users may want to target a specific compression ratio, such as 2:1 or 3:1, so that the encoded numerical data can be transferred through a desired bandwidth or stored on a desired capacity. In a third circumstance, users may want to specify a tolerable amount of error. For these reasons, it is desirable for an encoding and decoding algorithm to support one or more modes: lossless, fixed rate, and fixed quality. Alternative embodiments support one or more of the three modes, as further illustrated in FIGS. 34 and 35, with the following instructions:

SIMD attenuator initialization V_LOAD instruction 800,
Packet error calculation instructions 825, and
Attenuator update instruction 740 (needed for fixed-rate modes)

Referring back to FIG. 31, the amount of attenuation applied by attenuation instruction 820 in the main encoding loop is determined by the "atten" parameter loaded by SIMD attenuator initialization V_LOAD instruction 800. When the "atten" value is set to 1.0, the attenuation instruction 820 does not modify any of the numerical operands to be encoded. Similarly, if the "atten" value is set to less than 1.0 by SIMD attenuator initialization V_LOAD instruction 800, and is then never modified during compression processing, attenuation instruction 820 will apply the same attenuator value (less than 1.0) to every input sample to be compressed, which supports the fixed-quality mode. In the case where fixed-rate encoding is required, the "atten" value may change. When the numerical data are difficult to compress (more random than predictable), a smaller attenuator value removes more least significant bits of each operand, to increase the compression ratio. Similarly, when the numerical data are easier to compress (more predictable than random), a larger attenuator value preserves more least significant bits of each operand. To achieve a fixed output bit rate, the "atten" value may be modified, depending on the on-going (average) size of the sequence of compressed data packets in the packed array 2130.

FIG. 34 shows that SIMD attenuator initialization V_LOAD instruction 800 loads atten=1.0 for lossless mode, while fixed rate and fixed quality modes receive an initial atten value (less than 1.0). FIG. 34 further shows that the packet length calculation instruction 825 and packet length error calculation instruction 830 are not required for lossless and fixed quality modes, since the "atten" value may not be modified based on packet length, or block length, for these modes. Finally, FIG. 34 shows how the fixed rate encoding mode utilizes the following three instructions to update the "atten" value after each encoded block size has been calculated:

Packet length calculation instructions 825,
Packet length error calculation instruction 830,
V_UPDATE_ATTEN instruction 740, further detailed in FIG. 35.

FIG. 35 shows instructions for updating the "atten" value during fixed rate operation. After the packet length error is calculated, the atten value is adjusted by adding a fraction (mu) of the packet length error to the existing atten value. If the just-encoded packet was smaller than the target packet size, the packet length error will be positive and the attenuator value will be increased (less attenuation). If the just-encoded packet was larger than the target packet size, the packet length error will be negative and the attenuator value will be decreased (more attenuation). The adaptation constant mu controls the rate of adaptation of the attenuator feedback loop: a smaller mu corresponds to a slower update rate, while a larger mu corresponds to a larger update rate. The adaptation constant mu should be in the range {0.0, +1.0}, with a preferred value of 0.25.

FIG. 36 provides a cross-reference table for the SIMD encoding instructions that relates the following:
(Column 1) the element number of the SIMD encoding instruction,
(Column 2) the SIMD encoding instructions,
(Column 3) a description of the operations performed by the SIMD encoding instruction,
(Column 4) a list of figures related to the SIMD encoding instruction, FIG. 37 provides a cross-reference table for the SIMD decoding instructions that relates the following:
(Column 1) the element number of the SIMD decoding instruction,
(Column 2) the SIMD decoding instructions,
(Column 3) a description of the operations performed by the SIMD decoding instruction,
(Column 4) a list of figures related to the SIMD decoding instruction, A variety of implementation alternatives exist for the embodiments of the numerical encoders (compressors) and decoders (decompressors). The implementations can include logic to perform the processes described herein, where the logic can include dedicated logic circuits, configurable logic such as field programmable logic array FPGA blocks, configured to perform the functions, general purpose processors or digital signal processors that are programmed to perform the functions, and various combinations thereof. The above-referenced '312 application describes configurable compressors/decompressors that are applied to numerical data in a multi-core processing system. The numerical compression and decompression techniques using SIMD operations described herein may be implemented in the configurable compressors and decompressors described in the '312 application.

The numerical compression and decompression operations can be implemented in hardware, software or a combination of both and incorporated in computing systems. The hardware implementations include ASIC, FPGA or an intellectual property (IP) block. The numerical compression and decompression operations can be implemented in software or firmware on a programmable processor, such as a digital signal processor (DSP), microprocessor, microcontroller, multi-core CPU, or GPU. The compressed data packets may be provided for data transfer of compressed numerical data between components of a data processing system or computer system, such as between the data processor and memory, between multiple processor cores, between memories of the data processing system. The compressed data packets may also provide for data transfer of compressed numerical data over a communication channel or network to storage devices, computer readable media or to another data processing system.

Figure 38:
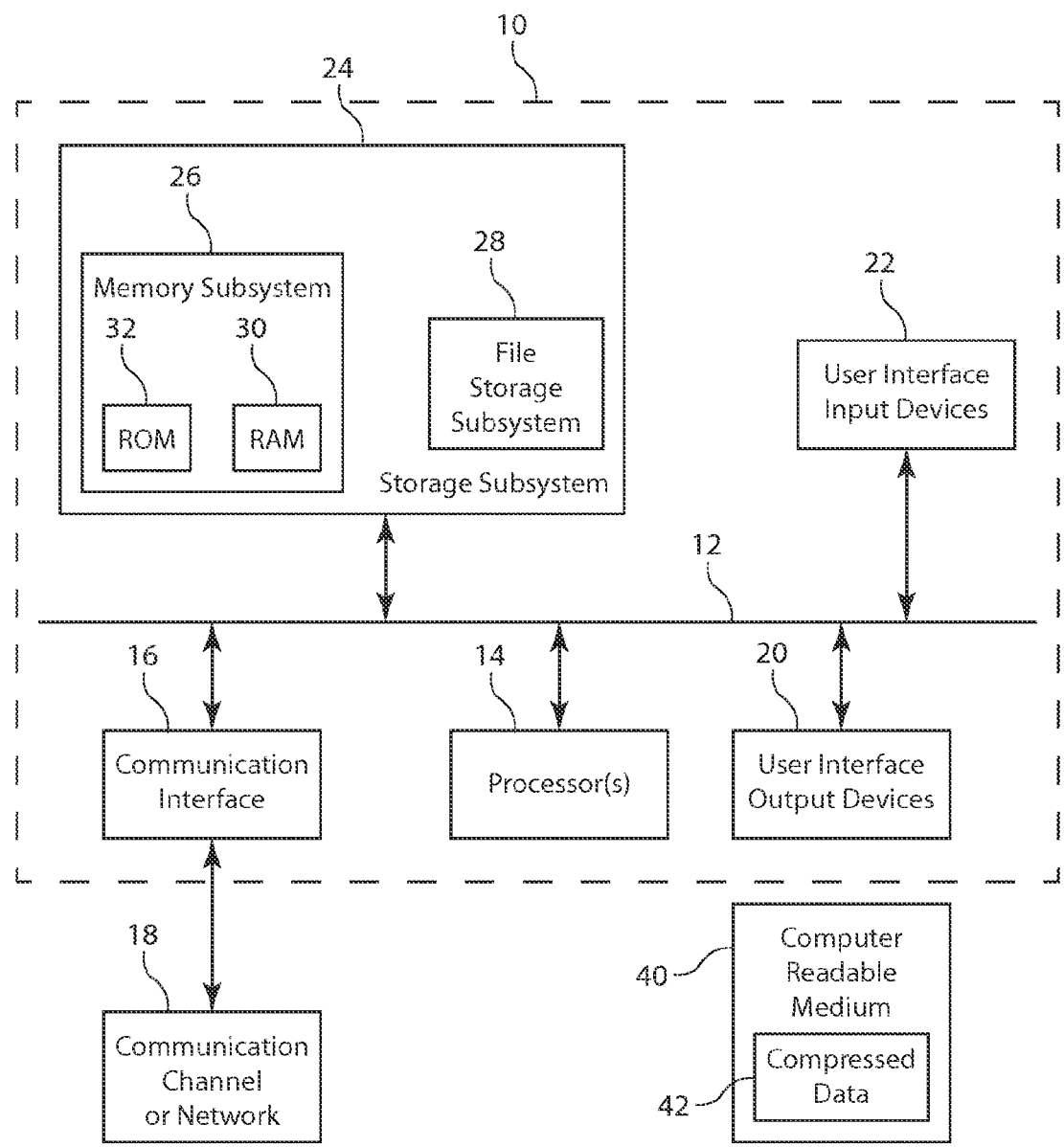
FIG. 38 is a block diagram of an exemplary computer system suitable for using SIMD operations for compression and decompression.

FIG. 38 is a block diagram of an exemplary computer system suitable for applying SIMD operations for compression and decompression. Computer system 10 typically includes at least one processor 14 which communicates with a number of peripheral devices via bus subsystem 12. These peripheral devices may include a storage subsystem 24, comprising a memory subsystem 26 and a file storage subsystem 28, user interface input devices 22, user interface output devices 20, and a communication interface subsystem 16. The input and output devices allow user interaction with computer system 10. Communication interface subsystem 16 provides an interface to communication channel or network 18, which may be a single channel or a communication network having multiple channels. The communication channel or network 18 is coupled to corresponding interface devices in other computer systems, transmitting or receiving devices, or an outside network (not shown). The communication channel or network 18 may comprise wireline links, optical links, wireless links, or any other mechanisms for communication of information. The communication network 18 may comprise many interconnected computer systems and communication links. While in one embodiment, communication network 18 is the Internet, in other embodiments, the communication network 18 may be any suitable computer network.

User interface input devices 22 may include a keyboard, pointing devices such as a mouse, trackball, touchpad, or graphics tablet, a scanner, a touch screen incorporated into the display, audio input devices such as voice recognition systems, microphones, and other types of input devices. In general, use of the term "input device" is intended to include all possible types of devices and ways to input information into computer system 10 that may be suitable for providing user inputs 101.

User interface output devices 20 may include a display subsystem, a printer, a fax machine, or non-visual displays such as audio output devices. The display subsystem may include a cathode ray tube (CRT), a flat-panel device such as a liquid crystal display (LCD), a projection device, or some other mechanism for creating a visible image. The display subsystem may also provide non-visual display, such as via audio output devices. In general, use of the term "output device" is intended to include all possible types of devices and ways to output information from computer system 10 to the user or to another machine or computer system.

Storage subsystem 24 stores the basic programming and data constructs that may provide some or all of the functions for the SIMD implementations of compression and/or decompression described herein. These software modules are generally executed by processor 14.

The processor(s) 14 may include one or more of a DSP, microprocessor, microcontroller, central processing unit (CPU) or graphics processing unit (GPU), or a combination of these devices. The processor(s) 14 may also include dedicated application specific integrated circuit (ASIC) or field-programmable gate array (FPGA) logic implementing some or all of the compression and/or decompression functionality. The processor(s) 14 include registers that may function as the SIMD registers and combinatorial logic having one or more pipeline stages to implement the SIMD instructions for compression and decompression described above. Memory subsystem 26 typically includes a number of memories including a main random access memory (RAM) 30 for storage of instructions and data during program execution and a read only memory (ROM) 32 in which fixed instructions are stored. The memory subsystem 26 may store parameters used for the operations of compression and decompression, such as exponent encoding table (FIG. 19) and exponent decoding table (FIG. 26). File storage subsystem 28 provides persistent storage for program and data files, and may include a hard disk drive, a floppy disk drive along with associated removable media, a CD-ROM drive, an optical drive, or removable media cartridges, including Universal Serial Bus (USB) thumb drives with USB interface and flash media storage. The databases and modules implementing the functionality of certain embodiments may be stored by file storage subsystem 28.

Bus subsystem 12 provides a mechanism for letting the various components and subsystems of computer system 10 communicate with each other as intended. Although bus subsystem 12 is shown schematically as a single bus, alternative embodiments of the bus subsystem may use multiple busses.

Computer readable medium 40 can be a medium associated with file storage subsystem 28, and/or with communication interface subsystem 16. The computer readable medium 40 can be a hard disk, a floppy disk, a CD-ROM, an optical medium, removable media cartridge, USB thumb drive, flash media storage, or electromagnetic wave. The computer readable medium 40 is shown storing a compressed data file 42 of data compressed using the SIMD operations described herein. The computer readable medium 40 may store programs or libraries implementing the functions of compression and/or decompression using SIMD instructions and may include an expanded instruction set for the processor(s) 14 that includes the SIMD instructions useful for compression/decompression programs or libraries. In some embodiments, the compression/decompression program or library or the expanded instruction set are configured for a specific hardware configuration, class of hardware configurations, or for one or more hardware accelerators. In other embodiments, the compression/decompression program or library or expanded instruction set include components that support a plurality of variant hardware configurations classes of hardware configurations.

In one embodiment, the compression/decompression library 80 is used by providing library access to a compiler, which links the application programs to the components of the library selected by the programmer. Access to the library by a compiler can be accomplished using a header file (for example, a file having a ".h" file name extension) that specifies the parameters for the library functions and corresponding library file (for example, a file having a ".lib" file name extension, a ".obj" file name extension for a Windows operating system, or a file having a ".so" file name extension for a Linux operating system) that use the parameters and implement the operations for compression/decompression, including at least some SIMD operations. The components linked by the compiler to applications to be run by the computer are stored, possibly as compiled object code, for execution as called by the application. In other embodiments, the library can include components that can be dynamically linked to applications, and such dynamically linkable components are stored in the computer system memory, possibly as compiled object code, for execution as called by the application. The linked or dynamically linkable components may comprise part of an application programming interface (API) that may include parameters for compression operations as described in the '898 application.

At least one of the processor(s) 14 includes an execution unit that comprises logic configured to execute single instruction multiple data (SIMD) instructions, including logic responsive to one or a combination of the following instructions:

(1) A first SIMD instruction (V_DERIV) that includes a multiple data identifier that identifies multiple operands, to calculate differences between a pairs of operands in the multiple operands identified by the multiple data identifier, to produce a plurality of difference value operands. A multiple data identifier can consist of a register pointer (e.g. "REG_A") that points to a SIMD register which is used by the logic to store multiple operands that are operated upon in execution of the instruction. The plurality of difference values can include the same number of result data values as are included in SIMD register. In connection with V_DERIV as described herein, the instruction identifies a single SIMD register that holds a number N, such as four or eight, operands, and identifies implicitly or explicitly, a location for the extra one, two or more operands that are used to generate the number N of differences for storage in an destination SIMD register.

(2) A second SIMD instruction (V_EXPMAX) that includes a multiple data identifier that identifies multiple operands to determine a maximum exponent value of the multiple operands identified by the multiple data identifier.

(3) A third SIMD instruction (V_PACK_REG) to pack a number of bits from each of the plurality of operands based on a maximum exponent value, which can be determined in response to the V_ECPMAX SIMD instruction for example, to form the compressed data group, wherein the compressed data group represents the plurality of operands.

(4) A fourth SIMD instruction (V_DECODE_MANTS) that includes a multiple data identifier that identifies a destination for multiple data values of constant data length, which using an exponent for a group of packed mantissas, decodes and sign-extends most significant bits for integer data types to produce the multiple data values identified by the multiple data identifier, or decodes and zero-fills least significant bits for floating point data types to produce the multiple data values identified by the multiple data identifier.

(5) A fifth SIMD instruction (V_INTEG) that includes a second multiple data identifier that identifies multiple operands, to calculate sums of pairs of operands in the multiple operands identified by the second multiple data identifier, to produce a plurality of integrated value operands.

The processor(s) 14 can be controlled using one or more of the SIMD instructions, along with other logic and instructions, to perform the compression and decompression processes described herein.

Implementations of execution units with SIMD registers and instruction sets vary by silicon vendor. In general, SIMD can be implemented using microcoded instructions that control programmable logic. In one example implementation, the existing 128-bit registers used in conjunction with the Intel SSE SIMD instruction set could also be used to store the operands for the instructions implementing the redundancy remover 1801 and bit packer 1802. Implementations of new SIMD instructions, such as those listed in FIGS. 36 and 37 would still require specification of one or more input operands (multiple data identifiers or register pointers) and the location where the result (output) operand(s) (register pointers) would be stored. Specifying the input and output registers could be similar to, or may even be identical to, how the input and output registers/operands are specified using existing SIMD instructions. The new instructions would include a new, unique opcode that specifies the new operation. When the new SIMD opcode (instruction) is invoked, combinatorial logic that corresponds to the new opcode (instruction) would access the one or more input operands from among the existing SIMD registers. Once the result has been generated by the combinatorial logic for the new instruction, the result(s) would be stored in the specified SIMD output register(s). Thus each new SIMD opcode (instruction) could typically (but not exclusively) be accompanied with dedicated logic for the new instruction, which would be used whenever the corresponding SIMD opcode is executed. For a given opcode (instruction), hardware accelerator implementations are possible that improve the speed and/or decrease the latency of the new instruction. Speed and latency are modified by varying the number of pipeline stages in the combinatorial logic for each new SIMD instruction. Other implementations of the new SIMD instructions may use dedicated input and output registers in addition to or instead of existing SIMD registers.

While the preferred embodiments of the invention have been illustrated and described, it will be clear that the invention is not limited to these embodiments only. Numerous modifications, changes, variations, substitutions and equivalents will be apparent to those skilled in the art, without departing from the spirit and scope of the invention, as described in the claims. What is claimed is:

The invention claimed is:

1. A computer system, comprising:
a data processor and memory accessible by the data processor, the memory storing computer programs executable by the data processor, including at least one application program and a set of functions to implement operations to perform compression of data samples from a data set, the at least one application program and the set of functions including single instruction multiple data (SIMD) instructions for at least a portion of the operations to be executed by the data processor, the data processor including a set of registers;
a first register of the register set to store a plurality of operands corresponding to an encoding group of data samples;
an exponent register of the register set, the data processor responsive to a SIMD instruction for operations to determine a maximum exponent value of the plurality of operands in the first register and to store the maximum exponent value in the exponent register;
interleaver logic to interleave bits of the operands in the first register to produce a plurality of nibbles to store in a second register of the register set, wherein the interleaver logic maps the bits to a given nibble based on a place value of the bits in respective operands;
a third register of the register set, the data processor responsive to a SIMD instruction for operations to select a subset of nibbles from the plurality of nibbles in the second register to store in the third register, wherein a number of nibbles for the subset is based on the maximum exponent value, wherein the subset of nibbles includes interleaved mantissa bits of the operands; and
logic to pack the interleaved mantissa bits of the subset of nibbles from the third register to a compressed data packet, wherein the packed interleaved mantissa bits represent compressed data for the encoding group of data samples.

2. The system of claim 1, wherein the operations further include operations to encode the maximum exponent value to generate an exponent token for the encoding group and to pack the exponent token in the compressed data packet.

3. The system of claim 2, further comprising a second exponent register of the register set to store a previous maximum exponent value, wherein the operations further include operations to calculate a difference between the maximum exponent value and the previous maximum exponent value to form an exponent difference and to encode the exponent difference to generate the exponent token.

4. The system of claim 3, further comprising exponent difference registers to store the exponent difference and a previous exponent difference, wherein the operations further include operations to encode the exponent difference and the previous exponent difference to generate the exponent token.

5. The system of claim 1, wherein the plurality of operands stored in the first register comprises a plurality of data samples for the encoding group from the data set.

6. The system of claim 1, further comprising:
an input register of the register set to store a plurality of data samples from the data set for the encoding group; and
a first derivative register of the register set, the data processor responsive to a SIMD instruction for operations to calculate derivatives of the plurality of data samples from the input register and to store the plurality of first derivate samples in the first derivative register.

7. The system of claim 6, wherein the operations include operations to select the input register or the first derivative register in accordance with a parameter, the selected register to provide the plurality of operands for the first register.

8. The system of claim 6, wherein the first derivative register provides the plurality of operands for the first register.

9. The system of claim 6, wherein the operations further include an operation to attenuate the plurality of data samples in accordance with an attenuation factor to produce a plurality of attenuated samples and to store the plurality of attenuated samples in the input register.

10. The system of claim 6, further comprising:
a second derivative register of the register set, the data processor responsive to a SIMD instruction for operations to calculate derivatives of the plurality of first derivative samples from the first derivative register and to store the plurality of second derivate samples in the second derivative register.

11. The system of claim 10, wherein the operations further include an operation to select the input register, the first derivative register or the second derivative register in accordance with a parameter, the selected register to provide the plurality of operands for the first register.

12. The system of claim 1, wherein the operands in the first register have a floating-point data format, wherein the operations to select the subset of nibbles provide the number of consecutive nibbles beginning with a most significant nibble of the second register for the subset.

13. The system of claim 1, wherein the operands in the first register have an integer data format, wherein the operations to select the subset of nibbles provide the number of consecutive nibbles beginning with a least significant nibble of the second register for the subset.

14. The system of claim 1, wherein a number of operands in the first register is four.

15. The system of claim 14, wherein the interleaver logic maps the bits having a particular place value in the four operands to a particular nibble in the plurality of nibbles.

16. A method for data compression using a data processor, the method comprising steps of:
storing a plurality of operands corresponding to an encoding group of data samples in a first register of a register set of the data processor;
determining a maximum exponent value of the plurality of operands in the first register;
interleaving bits of the operands in the first register to produce a plurality of nibbles to store in a second register of the register set, wherein the interleaving maps the bits to a given nibble based on a place value of the bits in respective operands;
selecting a subset of nibbles from the plurality of nibbles in the second register to store in a third register of the register set, wherein a number of nibbles for the subset is based on the maximum exponent value, wherein the subset of nibbles includes interleaved mantissa bits of the operands; and
packing the interleaved mantissa bits of the subset of nibbles from the third register to a compressed data packet, wherein the packed interleaved mantissa bits represent compressed data for the encoding group of data samples, wherein the data processor responds to at least one single instruction multiple data (SIMD) instruction to perform at least one of the steps.

17. The method of claim 16, further comprising:
encoding the maximum exponent value to generate an exponent token for the encoding group; and
packing the exponent token in the compressed data packet.

18. The method of claim 17, further comprising:
calculating a difference between the maximum exponent value and a previous maximum exponent value to form an exponent difference; and
encoding the exponent difference to generate the exponent token.

19. The method of claim 18, further comprising:
encoding the exponent difference and a previous exponent difference to generate the exponent token.

20. The method of claim 16, wherein the plurality of operands stored in the first register comprises a plurality of data samples for the encoding group from the data set.

21. The method of claim 16, further comprising:
storing a plurality of data samples from the data set for the encoding group in an input register of the register set; and
calculating derivatives of the plurality of data samples from the input register to form first derivative samples for a first derivative register of the register set.

22. The method of claim 21, further comprising selecting the input register or the first derivative register in accordance with a parameter, the selected register to provide the plurality of operands for the first register.

23. The method of claim 21, wherein the first derivative register provides the plurality of operands for the first register.

24. The method of claim 21, further comprising:
attenuating the plurality of data samples in accordance with an attenuation factor to produce a plurality of attenuated samples; and
storing the plurality of attenuated samples in the input register.

25. The method of claim 21, further comprising calculating derivatives of the plurality of first derivative samples from the first derivative register to form a plurality of second derivative samples for a second derivative register of the register set.

26. The method of claim 25, further comprising selecting the input register, the first derivative register or the second derivative register in accordance with a parameter, the selected register to provide the plurality of operands for the first register.

27. The method of claim 16, wherein the operands in the first register have a floating-point data format, the selecting a subset of nibbles to provide the number of consecutive nibbles beginning with a most significant nibble of the second register for the subset.

28. The method of claim 16, wherein the operands in the first register have an integer data format, the selecting a subset of nibbles to provide the number of consecutive nibbles beginning with the least significant nibble of the second register for the subset.

29. The method of claim 16, wherein a number of operands in the first register is four.

30. The method of claim 29, wherein the interleaving maps the bits having a particular place value in the four operands to a particular nibble in the plurality of nibbles.

31. An article of manufacture, comprising:
a memory readable by a data processor, the memory storing instructions executable by the data processor, including single instruction multiple data (SIMD) instructions for at least a portion of operations for data compression to be executed by the data processor, the operations to store a plurality of operands corresponding to an encoding group of data samples in a first register of a register set of the data processor, to determine a maximum exponent value of the plurality of operands in the first register, to interleave bits of the operands in the first register to produce a plurality of nibbles to store in a second register of the register set, the bits to be mapped to a given nibble based on a place value of the bits in respective operands, to select a subset of nibbles from the plurality of nibbles in the second register to store in a third register of the register set, wherein a number of nibbles for the subset is based on the maximum exponent value, the subset of nibbles to contain interleaved mantissa bits of the operands, and to pack the interleaved mantissa bits of the subset of nibbles from the third register to a compressed data packet, wherein the packed interleaved mantissa bits represent compressed data for the encoding group of data samples.

32. The article of manufacture of claim 31, wherein the operations further include operations to encode the maximum exponent value to generate an exponent token for the encoding group and to pack the exponent token in the compressed data packet.

33. The article of manufacture of claim 32, wherein the operations further include operations to calculate a difference between the maximum exponent value and a previous maximum exponent value to form an exponent difference and to encode the exponent difference to generate the exponent token.

34. The article of manufacture of claim 33, wherein the operations further include operations to encode the exponent difference and a previous exponent difference to generate the exponent token.

35. The article of manufacture of claim 31, wherein the operations further include an operation to store a plurality of data samples for the encoding group from the data set in the first register to provide the plurality of operands.

36. The article of manufacture of claim 31, wherein the operations further include operations to store a plurality of data samples from the data set for the encoding group in an input register of the register set and to calculate derivatives of the plurality of data samples from the input register to form first derivative samples for a first derivative register of the register set.

37. The article of manufacture of claim 36, wherein the operations further include operations to select the input register or the first derivative register in accordance with a parameter, the selected register to provide the plurality of operands for the first register.

38. The article of manufacture of claim 36, wherein the operations further include operations for the first derivative register to provide the plurality of operands for the first register.

39. The article of manufacture of claim 36, wherein the operations further include operations to attenuate the plurality of data samples in accordance with an attenuation factor to produce a plurality of attenuated samples and to store the plurality of attenuated samples in the input register.

40. The article of manufacture of claim 36, wherein the operations further include operations to calculate derivatives of the plurality of first derivative samples from the first derivative register to form a plurality of second derivative samples for a second derivative register of the register set.

41. The article of manufacture of claim 40, wherein the operations further include operations to select the input register, the first derivative register or the second derivative register in accordance with a parameter, the selected register to provide the plurality of operands for the first register.

42. The article of manufacture of claim 31, wherein the operations to select the subset of nibbles provide the number of consecutive nibbles beginning with a most significant nibble of the second register for the subset when the operands in the first register have a floating-point data format.

43. The article of manufacture of claim 31, wherein the operations to select a subset of nibbles provide the number of consecutive nibbles beginning with the least significant nibble of the second register for the subset when the operands in the first register have an integer data format.

* * * * *